United States Patent
Correale, Jr. et al.

(10) Patent No.: US 10,678,988 B2
(45) Date of Patent: Jun. 9, 2020

(54) INTEGRATED CIRCUIT (IC) DESIGN METHODS USING ENGINEERING CHANGE ORDER (ECO) CELL ARCHITECTURES

(71) Applicant: QUALCOMM Incorporated, San Diego, CA (US)

(72) Inventors: Anthony Correale, Jr., Raleigh, NC (US); Wolfgang Friedrich Bultmann, Cary, NC (US); William Goodall, III, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/220,621

(22) Filed: Dec. 14, 2018

(65) Prior Publication Data

US 2019/0188353 A1     Jun. 20, 2019

Related U.S. Application Data

(60) Provisional application No. 62/599,974, filed on Dec. 18, 2017.

(51) Int. Cl.
*G06F 30/392* (2020.01)
*G06F 30/30* (2020.01)
*G06F 30/3312* (2020.01)

(52) U.S. Cl.
CPC ............ *G06F 30/392* (2020.01); *G06F 30/30* (2020.01); *G06F 30/3312* (2020.01)

(58) Field of Classification Search
CPC ........ G06F 30/39; G06F 30/392; G06F 30/30; G06F 30/3312
USPC .................................................. 716/118, 139
See application file for complete search history.

(56) References Cited

U.S. PATENT DOCUMENTS

| | | | |
|---|---|---|---|
| 7,137,094 B2 | 11/2006 | Tien | |
| 8,117,581 B1 | 2/2012 | Li | |
| 2004/0064800 A1* | 4/2004 | Korobkov | G06F 30/392 716/122 |
| 2006/0017135 A1 | 1/2006 | Ogawa | |

(Continued)

OTHER PUBLICATIONS

Invitation to Pay Additional Fees and Partial International Search Report for PCT/US2018/065993, dated Mar. 18, 2019, 19 pages.

(Continued)

*Primary Examiner* — Paul Dinh
(74) *Attorney, Agent, or Firm* — W&T/Qualcomm

(57) ABSTRACT

Aspects disclosed in the detailed description include integrated circuit (IC) design methods using engineering change order (ECO) cell architectures. In particular, exemplary aspects provide a fill algorithm that is both single- and multi-row aware, considers a poly-pitch count, and utilizes metallization of the "empty space" relative to a suite of available fill cells. The algorithm is also aware of timing critical logic elements and may place ECO fill cells in near proximity to such timing sensitive circuits or other margin critical circuits to allow for decoupling or, if there is a logic error, an ECO cell is placed such that the ECO cell is well positioned to be repurposed as a delay circuit or other function to aid in margin control. For maximum flexibility, the algorithm may also address both pre- and post-route applications.

19 Claims, 16 Drawing Sheets

(56) References Cited

U.S. PATENT DOCUMENTS

2009/0267124 A1* 10/2009 Bosshard ............ H01L 27/0811
       257/296
2015/0370946 A1* 12/2015 Yang ....................... H01L 23/66
       257/532
2016/0092624 A1* 3/2016 Somayaji .............. G06F 30/392
       716/119

OTHER PUBLICATIONS

International Search Report and Written Opinion for PCT/US2018/065993, dated May 13, 2019, 24 pages.

* cited by examiner

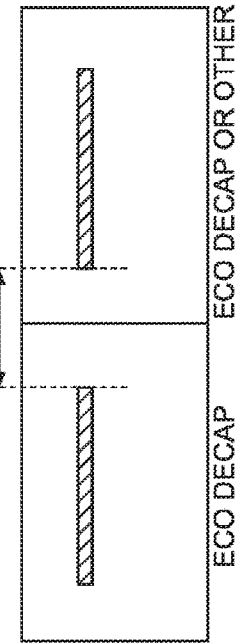
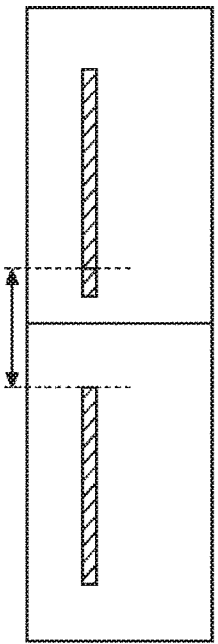
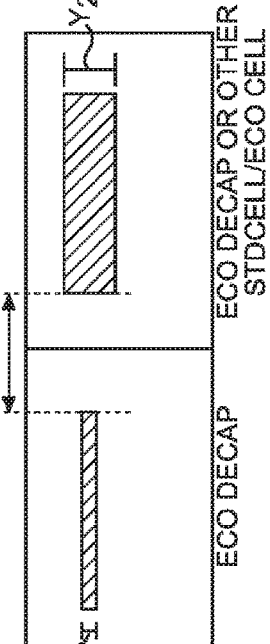
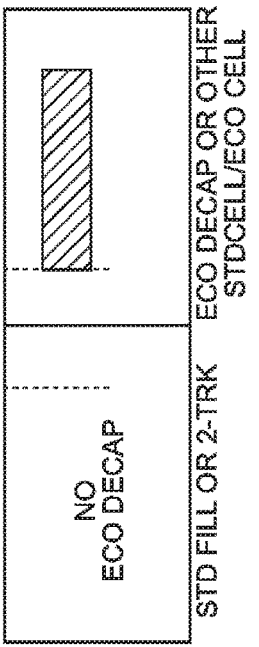
FIG. 11A
FIG. 11B
FIG. 11C
FIG. 11D
FIG. 11E

INTEGRATED CIRCUIT (IC) DESIGN METHODS USING ENGINEERING CHANGE ORDER (ECO) CELL ARCHITECTURES

PRIORITY CLAIM

The present application claims priority under 35 U.S.C. § 119(e) to U.S. Provisional Patent Application Ser. No. 62/599,974, filed on Dec. 18, 2017 and entitled "INTEGRATED CIRCUIT (IC) DESIGN METHODS USING ENGINEERING CHANGE ORDER (ECO) CELL ARCHITECTURES," the contents of which is incorporated herein by reference in its entirety.

BACKGROUND

I. Field of the Disclosure

The technology of the disclosure relates generally to improving integrated circuit (IC) designs by using engineering change order (ECO) designs.

II. Background

Computing devices have become increasingly common in modern society. Early computers were the size of a room and employed vacuum tubes to provide rudimentary mathematical calculations. In contrast, modern computing devices provide myriad multimedia, telephony, word processing, and other functions in a relatively small package relying on integrated circuits (ICs). The industry feels market pressure to provide ever increasing processing options in increasingly small products. While ICs have generally obeyed Moore's Law, continued advances in IC functionality in a smaller package is stressing manufacturing capabilities.

Current IC manufacturing processes rely on sequences of masks used in stages to create multi-level ICs, such as an active layer that may include one or more transistors with multiple layers of metal positioned thereover to provide interconnections between different transistors and provide connections to exterior pins. Vias or other vertical elements allow interconnections between layers. As the complexity of the IC increases, the mask count to make the IC also increases.

It is common to refer to the size of a channel between a source and a drain of a transistor as a process node size. Early ICs had process node sizes in the micrometer range. Current ICs are in the nanometer range with current designs calling for sub-ten nanometer process node sizes. As the process node size decreases into the low nanometer range, it is common to use a double or multi-pattern mask process for individual lithography steps for fabricating ICs. As an example, for a foundry to place two wires on the lowest metal layer (M0) on the tightest pitch with existing deep-ultraviolet lithography, foundries have had to resort to dual-patterning with some offering quad-patterning. That is, two masks are needed to process the dual-patterned M0. The same is true for cut-masks which allow for tighter end-to-end spaces of an existing layer, such as a polysilicon layer (sometimes shortened to poly or poly layer) and a "metal layer"-to-"diffusion layer" layer (sometimes shortened to metal-to-diffusion layer or MD layer or even just MD). The use of such multi-pattern mask processes further increases the number of masks required in the manufacturing process. For example, a typical IC having a seven nanometer (7 nm) process node size with fifteen levels of interconnecting metal may require more than eighty (80) masks.

Layers that are typically multi-patterned are the poly layer, the MD layer, the metal layer-to-poly layer (sometimes shortened to MP), the vias between the diffusion layer and MD and/or M0 (sometimes referred to as VD), the vias between the poly or MP layer and M0 (sometimes referred to as VG), the cutting of the MD layer (sometimes referred to as CMD), the cutting of the poly layer (sometimes referred to as CPO), the cutting of the M0 layer (sometimes referred to as cut-M0), M0, the via between MP or MD to M0 (sometimes referred to as V0), M1, M2, M3, and the V1 and V2 vias. As used herein, the word "via" includes its use as an acronym for "vertical interconnect access."

Because most of the multi-patterned layers are used early in the manufacturing process, most of the complexity in the manufacturing process is associated with the front-end-of-line (FEOL) transistor formation and middle-end-of-line (MEOL or MOL) local interconnect and lower levels of metal formation. Back-end-of-line (BEOL) handling of metals and vias is considered to begin around the fourth level of metal (sometimes referred to as M4 (or M3 if the first level of metal is M0)).

While definitions of what is properly considered MEOL may vary, the MD, CMD, MP, VD, VG, M0-M3, and CM0 layers and the V0, V1, and V2 vias can be considered to be fabricated as MEOL fabrication steps. In a typical mask process, each "mask" may actually be a sequence of masks. For example, if the MP mask sequence is the thirtieth (30th) "mask," it should be appreciated that there may be two masks associated with a dual-patterned MP. In an eighty (80) mask sequence process, FEOL and MEOL may constitute approximately the first forty (40) or so sequences of masks for example.

It should be appreciated that such complex, multi-mask processes are expensive. For example, when designs are released to a foundry or other manufacturing, it is common for the mask set cost to exceed one million dollars. Additionally, the manufacturing time is on the order of three months for the first silicon to be ready. Consequently, if a design defect is detected, there is a substantial expense in redesigning the masks and a substantial delay in resuming manufacturing.

In today's Very Large Scale Integration (VLSI) chip designs, pattern density and uniformity are critical. As such, any "empty" regions of an IC are generally filled with generic cells for pattern density and/or an engineering change order (or option) (ECO) cell. The fill (sometimes also referred to as filler) cells attempt to match patterns associated with the FEOL and some MEOL. These fill cells rarely have any specific function ascribed to them other than pattern matching. Some ECO cells may have pattern matching attributes, and are also capable of being transformed into a select set of logic functions, which may provide the ability to fix a logic bug or other error without requiring the entire mask set to be rebuilt.

Some ECO cells may utilize a more sophisticated implementation that allows the ECO cell to be readily modified into a logic function. Such modification may be done with changes to relatively few masks, where the changes are made relatively deep in the mask sequence, thereby saving time to market and overall cost. ECO cells may utilize many of the same manufacturing levels as a fill cell and/or a standard cell. Placement of these cells must be consistent with the metallurgy already used if placed after metallurgy routing is assigned. If the placement of a fill cell is done before metallurgy routing is assigned, then some form of wiring density assessment must be done to ensure adequate routability in the regions where the ECO cells are placed.

Various fill algorithms exist which interoperate with pick and place software to place active logic elements within an IC and fill the white space with fill cells. However, such fill algorithms may not consider how best to utilize empty space for ECO cells and the accompanying metallization routing issues that may occur as the ECO cells are customized for use as a logic element other than a fill cell.

SUMMARY OF THE DISCLOSURE

Aspects disclosed in the detailed description include integrated circuit (IC) design methods using engineering change order (ECO) cell architectures. In particular, exemplary aspects provide a fill process that is both single- and multi-row aware, considers a poly-pitch count, and utilizes metallization of the "empty space" relative to a suite of available fill cells. The process is also aware of timing critical logic elements and may place ECO fill cells in near proximity to such timing sensitive circuits or other margin critical circuits to allow for decoupling or, if there is a logic error, an ECO cell is placed such that the ECO cell is well positioned to be repurposed as a delay circuit or other function to aid in margin control. For maximum flexibility, the process may also address both pre- and post-route applications.

In exemplary aspects, the process may be weighted to place ECO cells as fill cells in as much of any available empty space followed by alternate fill cells. The process may also be weighted to consider poly-pitch and multi-row arrangements so that multiple ones of the ECO cells may be placed adjacent one another in multiple axes so as to provide greater flexibility in ECO changes with minimal disruption to the original mask sequence.

In this regard in one aspect, a method of designing an IC is disclosed. The method includes determining an initial circuit layout for the IC. The method also includes determining an empty space in the initial circuit layout. The method also includes placing a multi-row decoupling capacitor (DCAP) cell including a DCAP circuit in at least a first empty space in the initial circuit layout. The method also includes placing a single-row DCAP cell in at least a second empty space in the initial circuit layout. The method also includes generating a second circuit layout for the IC after the DCAP cells are placed.

In another aspect, an IC is disclosed. The IC includes a first region occupied by a logic element. The IC also includes a second region occupied by a multi-row DCAP cell. The IC also includes a third region occupied by a single-row DCAP cell. The IC also includes a fourth region occupied by a pattern-matching fill cell.

In another aspect, a non-transitory computer-readable medium having stored thereon computer executable instructions is disclosed. The instructions, when executed by a processor, cause the processor to determine an initial circuit layout for an IC. The instructions also cause the processor to determine empty space in the initial circuit layout. The instructions also cause the processor to place a multi-row DCAP cell in at least a first empty space in the initial circuit layout. The instructions also cause the processor to place a single-row DCAP cell in at least a second empty space in the initial circuit layout. The instructions also cause the processor to generate a second circuit layout for the IC after the DCAP cells are placed.

BRIEF DESCRIPTION OF THE FIGURES

FIGS. 11A-11E illustrate a process for checking lateral clearance in the metal layers before placing an ECO cell;

DETAILED DESCRIPTION

Figure 1:
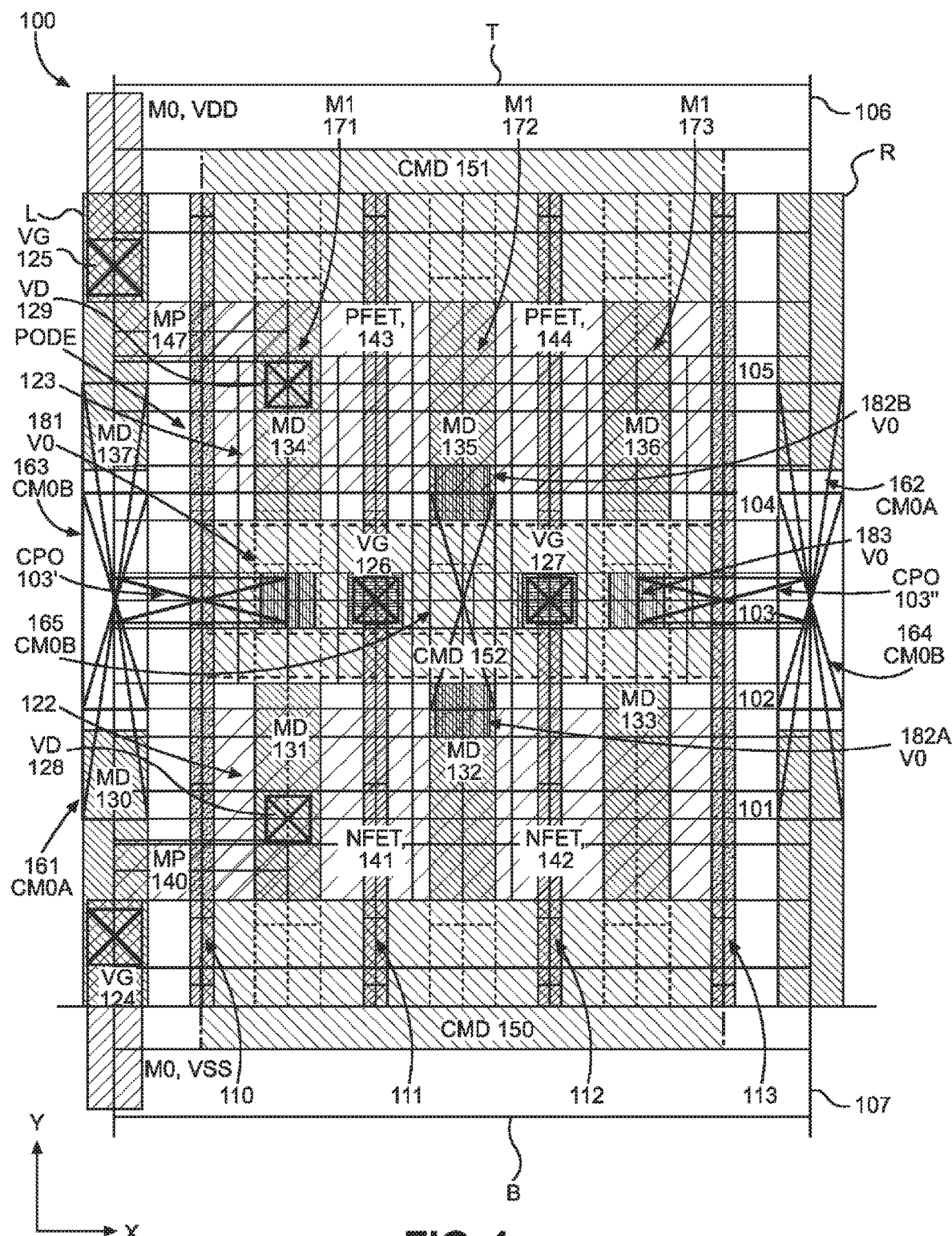
FIG. 1 is a top plan view of an unconfigured engineering change order (ECO) logic cell suitable for use with a placement process according to an exemplary aspect of the present disclosure.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include integrated circuit (IC) design methods using engineering change order (ECO) cell architectures. In particular, exemplary aspects provide a fill process that is both single- and multi-row aware, considers a poly-pitch count, and utilizes metallization of the "empty space" relative to a suite of available fill cells. The process is also aware of timing critical logic elements and may place ECO fill cells in near proximity to such timing sensitive circuits or other margin critical circuits to allow for decoupling or, if there is a logic error, an ECO cell is placed such that the ECO cell is well positioned to be repurposed as a delay circuit or other function to aid in margin control. For maximum flexibility, the process may also address both pre- and post-route applications.

In exemplary aspects, the process may be weighted to place ECO cells as fill cells in as much of any available empty space followed by alternate fill cells. The process may also be weighted to consider poly-pitch and multi-row arrangements so that multiple ones of the ECO cells may be placed adjacent one another in multiple axes so as to provide greater flexibility in ECO changes with minimal disruption to the original mask sequence.

Before addressing exemplary aspects of the present disclosure a few definitions are provided to assist with acronyms that may appear elsewhere in the disclosure.

Middle-end-of-line (MEOL) may also sometimes be referred to as MOL. MEOL or MOL is generally associated with local interconnect and lower levels of metal formation.

Front-end-of-line (FEOL) is associated with transistor formation and occurs first in the manufacturing process (hence—front).

Back-end-of-line (BEOL) is generally associated with handling metals layers and vias.

Metal layers exist to allow interconnections between active elements. While the precise number of metal layers may vary, there are typically more than four (4), and perhaps more than fifteen (15) metal layers. These are referred to as M0-Mx where x is an integer one less than the number of metal layers. Thus, if there are eight (8) metal layers, these would be denoted M0-M7. M0 refers to the lowest metal layer—i.e., closest to the layer with the active elements thereon—and M7 would be the highest metal layer (generally the last metal layer created in the circuit). Some industry participants refer to the lowest metal layer as M1 instead of M0. However, such nomenclature is not used herein. Even in this alternate naming approach, the higher the number, the higher the metal layer (i.e., more removed from the substrate).

Polysilicon layers (sometimes shortened to poly or poly layers) are usually used to form gates for transistors and in some processes are actually metal but still referred to as poly.

MD—a "metal layer"-to-"diffusion layer" layer. The layer in-between the metal layer M0 and the diffusion layer.

MP—a metal layer-to-poly layer.

VD—the vias between the diffusion layer and MD and M0.

VG—the vias between the poly or MP layer and M0.

CMD—the cutting of the MD layer.

CPO—the cutting of the poly layer

Cut-M0 (CM0)—the cutting of the M0 layer.

V0—the via between M0 to M1.

To better assist in understanding exemplary aspects of the present disclosure, a brief explanation of a useful ECO cell is provided. This ECO cell is fully explained in U.S. Provisional Patent Application Ser. No. 62/582,406, filed Nov. 7, 2017, and U.S. patent application Ser. No. 16/181,456, filed Nov. 6, 2018, both entitled "Engineering Change Order (ECO) Cell Architecture and Implementation," both of which are herein incorporated by reference in their entireties, and the interested reader if referred thereto. This ECO cell architecture utilizes all manufacturing levels up to and including M1 and requires changes only to the VD mask to transform the ECO cell into one of a plethora of logic functions. The ECO cell described in the '406 application and the '456 application has a fixed linear dimension, defined in a finite number of poly-pitches, which is readily amenable to easy inclusion in IC designs. The ECO cell uses four (4) poly-pitches. Coupling multiple ones of the ECO cells either in the x-axis dimension or the y-axis dimension allows for even greater complex functions to be realized. The coupling of the ECO cells may require additional connections in the metal layers (e.g., M1 or M2). Of interest to the present disclosure is the use of the ECO cells as a decoupling capacitor (DCAP), which uses two of the ECO cells with M2 and V1 vias added to complete the function.

Specifically, the cell may have a four (4) poly track uniform configuration (two poly gates per cell) with the ability to configure complex functions of higher drive strength circuits by using multiple instances of a background ECO cell placed either laterally or vertically. The cell may have a common poly pitch relative to standard cells within the IC and fixed threshold implants. Such commonality allows for better pattern matching. The cell may include fin Field Effect Transistors (FETs) (finFETs) having a fin count consistent with the cell height. The cell may have a common power and ground rail relative to standard cells within the IC. The power and ground connections may be to ancillary signal wire or wires dedicated to supporting power and ground to retargetable ECO cells without altering the existing distribution of surrounding cells. The cell may have fixed power contacts on the respective power rails. The cell may have fixed power contacts on any ancillary signal tracks on a background cell and may further have the ability to add additional contacts during customization. The cell may have fixed VG and MP connections to the poly gates. There may be fixed MP usage. There may be fixed M1 connections to each gate and output thereby reducing need for any M1 mask changes. The cell may include fixed V0 vias within the cell to make fixed connections to predefined locations in the M1 layer. The cell may allow the customization to be done exclusively on the VD layer for many logic functions, minimizing the impact of changes on any other layer. Other logic functions may be instantiated through the use of two or more ECO cells with VD customization along with M2 and V1 interconnections between ECO cells. Such capability allows for modifications on only two masks along with any V1 and M2 changes. Still further, the cell may require no optical proximity correction or additional pattern fills for the FEOL or most of the MEOL as only the VD mask is changed for customization.

To assist the reader, an overview of the ECO cell is provided with reference to FIG. 1. An alternate ECO cell, also described in the '406 application and the '456 application, is described below with reference to FIG. 12. While these two ECO cells are specifically contemplated, it should be appreciated that other ECO cells may be used with the processes described herein. Likewise, variations to fit within ICs having different cell sizes may be made without departing from the present disclosure. However, for the sake of illustration, these cells are used.

In this regard, FIG. 1 illustrates an ECO cell 100. The ECO cell 100 is rectilinearly shaped and is four (4) poly pitches wide laterally in the x-axis (from left edge (L) to right edge (R)). In an exemplary aspect, the ECO cell 100 is three hundred nanometers (300 nm) from a top (T) to a bottom (B).

The ECO cell 100 includes five (5) signal wires, M0 tracks 101-105, running on an M0 mask layer in the x-axis direction (L or R (or R to L)). The top (T) of the ECO cell 100 has an edge with a shared power line (VDD), M0 track 106, running laterally across the ECO cell 100 on the M0 layer. The bottom (B) of the ECO cell 100 has an edge with a shared ground (VSS), M0 track 107, running laterally across the ECO cell 100 on the M0 layer. The M0 tracks 101 and 105 are dedicated to VSS and VDD as will be explained in greater detail below.

The ECO cell 100 has polysilicon shapes 110-113 running orthogonal to the M0 shapes (i.e., from T to B (or B to T)) in the y-axis direction. Polysilicon shapes 111 and 112 are associated with n-type FETs (NFETs) 141 and 142 and p-type FETs (PFETs) 143 and 144 formed by the intersection of diffusion shapes 122 and 123. Polysilicon shape 110 is proximate edge L and a left edge of the diffusion shapes 122 and 123, while polysilicon shape 113 is proximate edge R and a right edge of the diffusion shapes 122 and 123. The polysilicon shapes 110 and 113 do not form any devices. Polysilicon shapes 110 and 113 are sometimes referred to as poly-on-diffusion-edge (PODE) and are inset one-half a poly-to-poly and diffusion-to-diffusion ground rule space from the left edge L and the right edge R of the ECO cell 100 to ensure no connectivity between adjacently-related cells.

With continued reference to FIG. 1, MD shapes 131-136 provide overlays to the diffusion shapes 122 and 123 to reduce diffusion resistance while allowing connection to the M0 shapes (i.e., the M0 tracks 101-107). VD vias provide a means to connect the MD layer to the M0 layer (none shown). Sometimes the VG vias, which are normally used to connect a polysilicon gate to the M0 layer through an MP layer, can be used to make M0 connections to the MD layer. VG via 124 is used to connect MD shape 130 to M0 VSS. Likewise, VG via 125 is used to connect MD shape 137 to M0 VDD. VG vias 126 and 127 overlay MP shapes thereby making connections to polysilicon gates of the FETs 141 and 143, and 142 and 144 respectively, and connections to M0 track 103.

MP shapes 140 and 147 provide connections from MD shapes 130 and 137 to MD shapes 131 and 134, respectively. The MP shapes 140 and 147 are sometimes referred to as jumpers. The MP shapes 140 and 147 also connect to the left-edge polysilicon shape 110 at the PODE boundary. Since the polysilicon shape 110 has a CPO (cut poly) 103' at the mid-point of the ECO cell 100, no connection is made between VDD and VSS. The polysilicon shape 113 also has a CPO 103" on the right-most edge ensuring no unwanted connections.

Connections to the M0 tracks 101 and 105 are through fixed VD vias 128 and 129, respectively. Thus, the path formed from the VG vias 124, 125, the jumpers 140, 147, and the VD vias 128 and 129 establish the M0 tracks 101 and 105 as the VSS and VDD, respectively. When the ECO cell 100 is customized, such customization may use M0 track 101 for VSS and M0 track 105 for VDD connections rather than have to couple to the M0 tracks 106 and 107 on the top (T) and bottom (B) of the ECO cell 100. The source of the NFET 141 and the drain of the PFET 143 are connected to VSS and VDD, respectively through the VD vias 128 and 129. The drain of the NFET 141, the source of the NFET 142, and the drain of the NFET 142 remain unconnected in the ECO cell 100 allowing customization as explained in greater detail below. Likewise, the source of the PFET 143, the drain of the PFET 144, and the source of the PFET 144 remain unconnected in the ECO cell 100.

With continued reference to FIG. 1, the ECO cell 100 further includes CMD shapes 150 and 151, which are located along the bottom (B) and the top (T) of the ECO cell 100 to ensure no MD connections between cells that are adjacent in the y-axis direction. The CMD shapes 150 and 151 cut the MD shapes 131-136. CMD shape 152, located in the 'center,' isolates the MD shapes 131-133 from the MD shapes 134-136. Further, the CMD shape 152 also isolates MP shapes located on the polysilicon shapes 111 and 112. This center CMD shape 152 must be applied over the MP shapes connecting to the polysilicon gates to ensure no shorting between MD and MP.

Since there are no direct MD connections between the source/drain (the diffusion shape 122) of the NFETs 141 and 142 and the source/drain (the diffusion shape 123) of the PFETs 143 and 144, all connections are made on M1 running vertically in parallel to the polysilicon shapes 111 and 112. These M1 shapes 171, 172, 173 are connected to M0 through V0 vias. Connections between MD and M0 will be made with VDNG vias, as was shown for the power and ground connections.

Like the CMD shapes 150 and 151 which were used to cut MD to ensure no connectivity along the top (T) and the bottom (B) and within the ECO cell 100 as needed, CPO shapes perform a similar function with respect to elements in the poly layer. A cut-M0 (CM0) set of shapes is employed along the cell left/right boundaries to ensure no lateral connectivity between cells on the M0 layer. These shapes, like many others, can be multi-patterned to afford the best lithography. The M0 shapes are one such set that is multi-patterned. In FIG. 1, the M0 shapes associated with the M0 tracks 101, 103, and 105 belong to one pattern set while the M0 shapes associated with the M0 tracks 102, 104, 106, and 107 belong to another pattern set. Since the M0 layer is dual-patterned, it stands to reason that the CM0 shapes are dual-patterned as well.

In FIG. 1, the left and right edges of the ECO cell 100 have cut-M0 patterns CM0A 161 and 162. Cut-M0 patterns CM0B 163 and 164 cut the M0 track 103. Thus, the ECO cell VSS and VDD will be shared across all adjacent ECO cells through M0 tracks 101 and 105, thereby creating a parallel VSS/VDD path throughout all ECO cells. CM0B 165 is introduced to cut the M0 track 103 at mid-track. This cut breaks the continuity between the device set of the NFET 141 and the PFET 143 and those associated with the device set of the NFET 142 and the PFET 144 through the VG vias 126 and 127, respectively. This CM0B 165 allows the gates of these respective device sets to be connected as needed through other higher sequence masking steps.

The ECO cell 100 incorporates fixed location M1 and V0 via shapes. A first M1 track 171 is located to the left of the VG via 126 in a first M1 track location. A V0 via 181 is located at the intersection of the first M1 track 171 and the M0 track 103. This arrangement forms an M0 to M1 to VG connection. The gates of the first device set of the NFET 141 and the PFET 143 are connected to the first M1 track 171. Likewise, a third M1 track 173 is located to the right of the VG via 127 in a third M1 track location. A V0 via 183 is located at the intersection of the third M1 track 173 and the M0 track 103. This arrangement forms an M0 to M1 to VG connection. Thus, the gates of the second device set of the NFET 142 and the PFET 144 are now connected to the third M1 track 173. Finally, a second M1 track 172 is located between the first and the third M1 tracks 171 and 173. The second M1 track 172 has two V0 vias associated with it. One V0 via 182A intersects the M0 track 102 and another V0 via 182B intersects the M0 track 104. Thus, the second M1 track 172 connects the M0 tracks 102 and 104.

It should be appreciated that terms like top, left, right, and bottom are used for convenience and are relative to the orientation of the Figure, and not strictly required for implementation.

With this basic architecture in the ECO cell 100, myriad possibilities are now available to customize the ECO cell 100 in such a manner as to help cure design defects without having to redesign FEOL or early MEOL masks with associated changes throughout the rest of the mask set. Thus, use of the ECO cell 100 as a filler cell helps provide pattern matching and helps provide flexibility for curing design defects.

To recap, the ECO cell 100 has an x-axis dimension of four (4) poly pitches (PP) and a y-axis dimension consistent with the standard cell height. The ECO cell 100 employs three M1 tracks 171, 172, and 173, two of which (171 and 173) readily operate as inputs and one of which (172) readily operates as an output. Utilizing these predefined M1 tracks 171, 172, and 173, and their associated predefined V0 vias 181, 182A, 182B, and 183 allows one to transform the ECO cell 100 using just VD for most applications.

One specifically contemplated function for the ECO cell 100 is a decoupling capacitor (DCAP), which uses multiple instantiations of the base ECO cell 100, and specifically uses two ECO cells 100 and two M2 wiring tracks to complete the interconnectivity. The multiple instantiations may be in the x-axis for a single-row implementation or placed one above another in the y-axis to create a multi-row implementation. Both of these implementations are discussed below with reference to FIGS. 2A-3B. It should be appreciated that the single-row aspect uses eight (8) poly-pitches with two M2 tracks. In contrast, for the multi-row aspect, only four (4) poly-pitches are used, with one instance in each row (i.e., twice normal height in the y-axis direction), and one M2 track in each of the two rows. The M2 track customization can be uniform each time a DCAP is made or can be dynamically altered to fit the available tracks when placed. Alternatively, a predefined set of M2 customizations may be stored in a library for use with the ECO cells. Even when used as a DCAP, the ECO cells 100 still provide pattern matching. Further, use as a DCAP may be reversed and the ECO cell 100 repurposed to cure design defects without adversely affecting the overall operation of an IC.

Figure 2A:
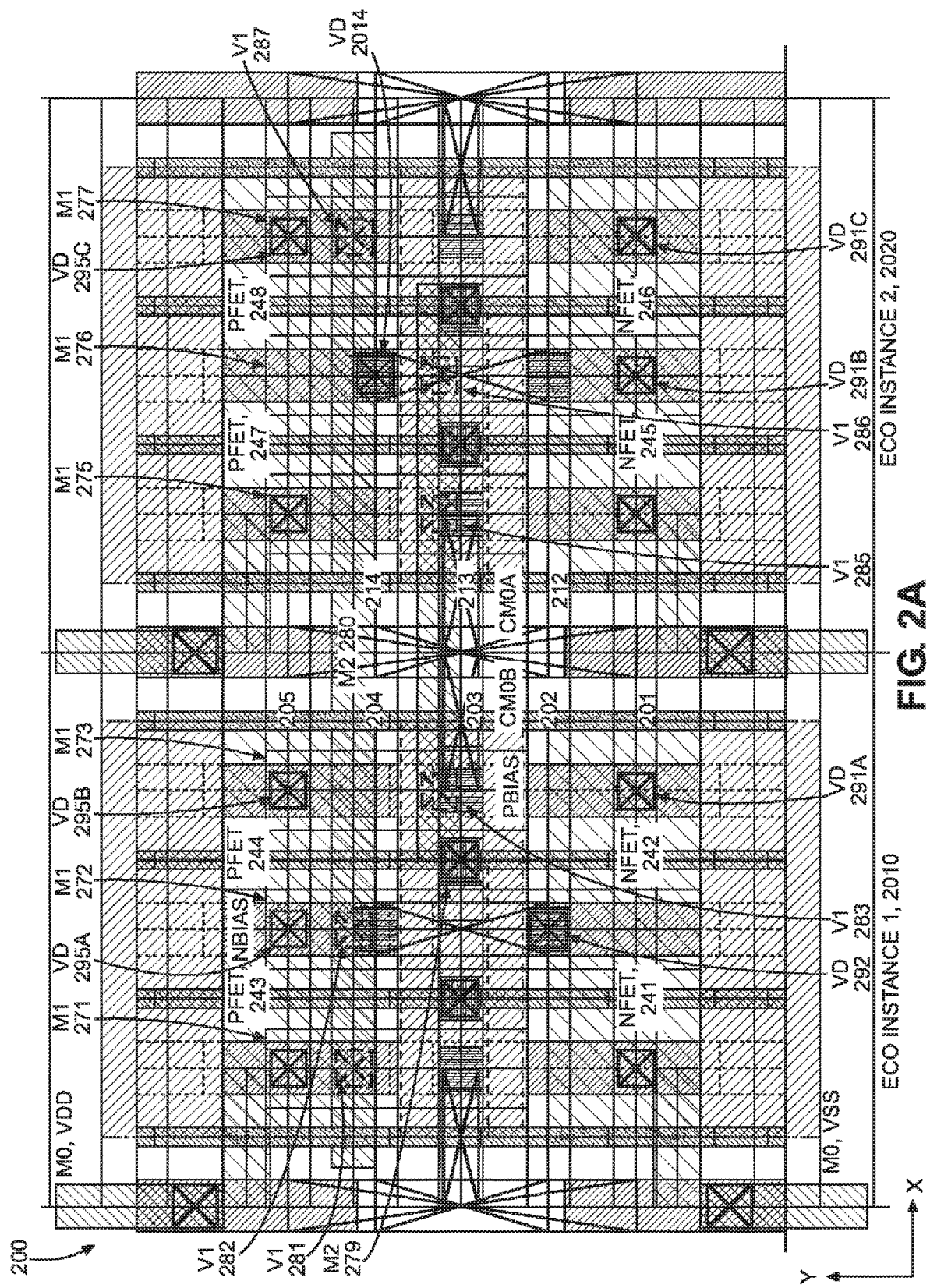
FIG. 2A is a top plan view of two ECO logic cells from FIG. 1 configured to be a decoupling capacitor (DCAP) circuit, where the ECO logic cells are adjacent relative to a first axis.
Figure 2B:
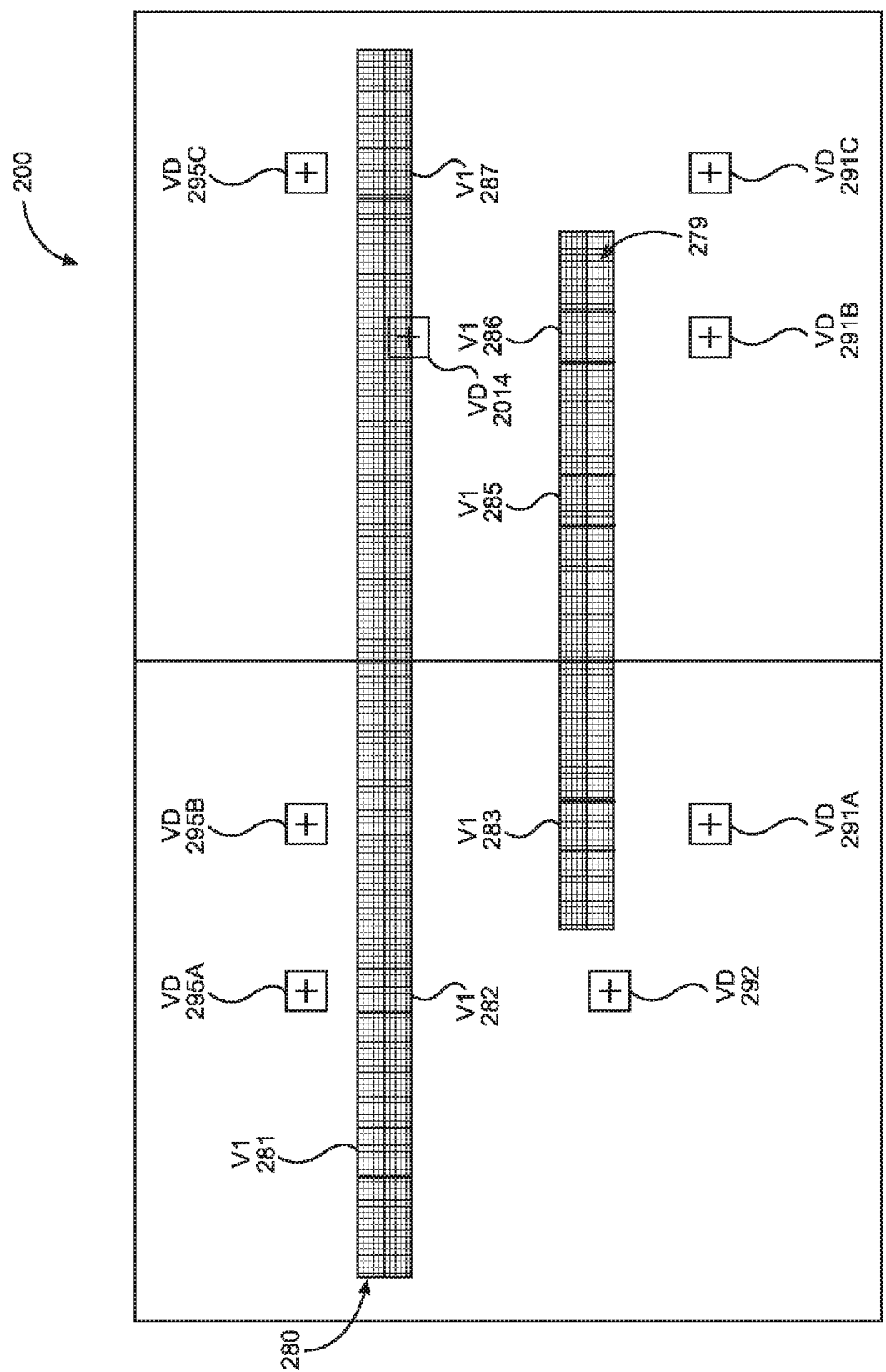
FIG. 2B is a top plan view of the M2 metallization layer, instances of V1 vias between the M2 layer and M1 layer (not shown) and instances of vias between the diffusion layer and the metal-to-diffusion layer or lowest metal layer (M0) (VD) instances of the DCAP circuit of FIG. 2A in isolation.

FIG. 2A illustrates a two-cell DCAP circuit 200 and FIG. 2B illustrates a metallization layer M2 that interconnects the two ECO cells. In particular, two ECO cells 2010 and 2020 are used. The ECO cell 2010 has NFETs 241 and 242 and PFETs 243 and 244. Similarly, the ECO cell 2020 has NFETs 245 and 246 and PFETs 247 and 248. M1 tracks 271-273 are used in the ECO cell 2010. M1 tracks 275-277 are used in the ECO cell 2020. M0 tracks 201 and 205 are continuous across both the ECO cells 2010 and 2020 to provide a continuous VSS and VDD, respectively. M0 tracks 202, 203, and 204 are isolated from M0 tracks 212, 213, and 214 by cutouts CM0A and CM0B as previously explained.

With continued reference to FIG. 2A the ECO cells 2010 and 2020 are further modified by the addition of M2 shape 279, which provides interconnections through added V1 vias 283, 285, and 286 to the M1 tracks 273, 275, and 276, respectively. This arrangement forms the pbias metal network. More detail can be found in the previously incorporated '406 and '456 applications. Likewise, the ECO cells 2010 and 2020 are further modified by the addition of M2 shape 280, which provides interconnections through added V1 vias 281, 282, and 287 to the M1 tracks 271, 272, and 277, respectively. This arrangement forms the nbias metal network. To complete all the source and drain connections, VD vias 291A, 291B, 291C, 292, 295A, 295B, 295C, and 2014 are also added. The M2 shapes 279 and 280 along with the VD vias 291A, 291B, 291C, 292, 295A, 295B, 295C, and 2014 and the V1 vias 281, 282, 283, 285, 286, and 287 are also illustrated in FIG. 2B.

Figure 3B:
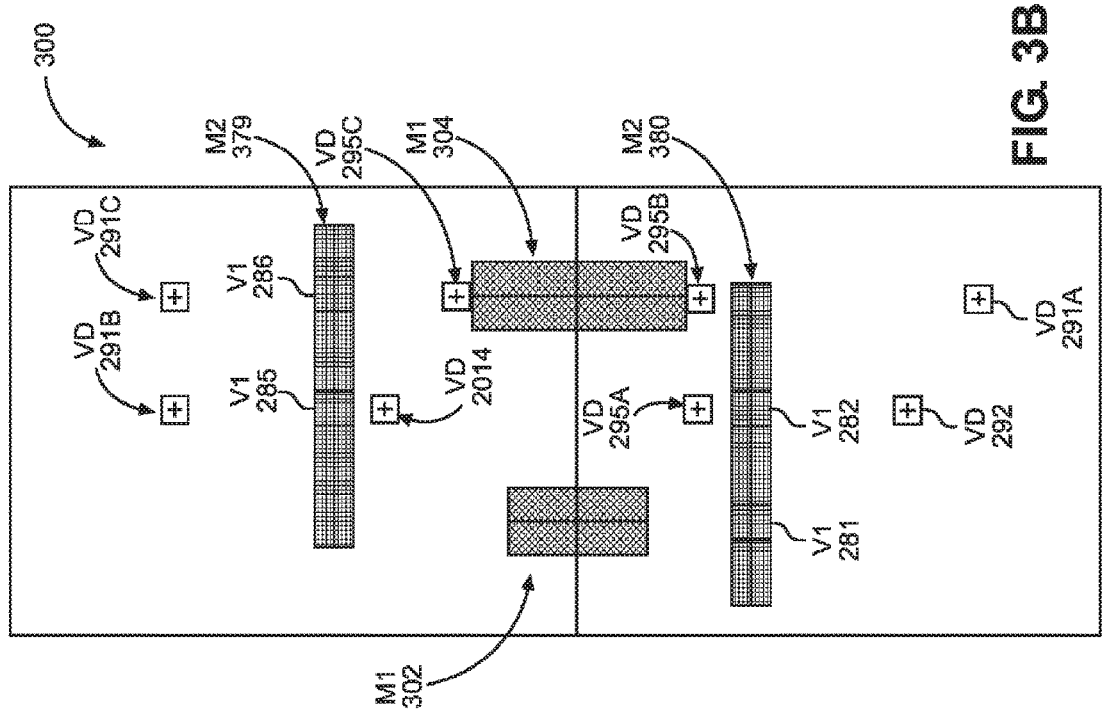
FIG. 3B is a top plan view of the M2 metallization layer, instances of V1 vias between the M2 layer and the M1 layer, and instances of VD vias of the DCAP circuit of FIG. 3A in isolation.
Figure 3A:
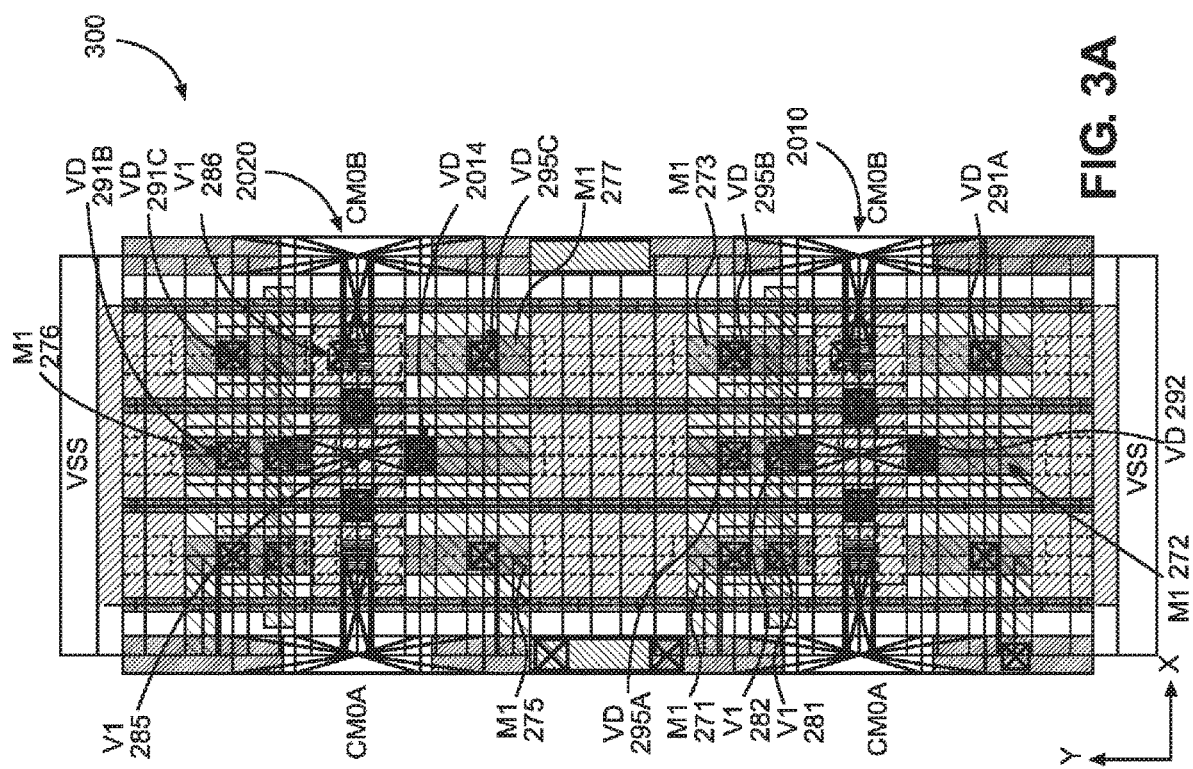
FIG. 3A is a top plan view of two ECO logic cells from FIG. 1 configured to be a DCAP circuit, where the ECO logic cells are adjacent relative to a second axis.

Thus far, FIGS. 2A and 2B show the lateral placement of ECO cells to create a DCAP circuit, but multi-row or stacked realizations that employ the ECO standard cells are also specifically contemplated and within the scope of this disclosure. Referring back to FIG. 2A wherein the DCAP circuit 200 was realized as a lateral arrangement of ECO cells, a vertical stacking of ECO cells may realize the same function. FIGS. 3A and 3B illustrate a DCAP circuit 300 where the ECO cells 2010 and 2020 are vertically stacked (i.e., in the y-axis direction). It should be noted that the ECO cells 2010 and 2020 have different VD via customizations, which impact the vertical stacking. Thus, this vertical stacking can be accomplished by maintaining the placement of the ECO cell 2010 as is, with the same orientation and same x, y location and the same VD via customizations (also referred to as personalizations), and placing the ECO cell 2020 such that the VD customizations are preserved. The M0 metal tracks carrying the VSS and VDD are mirror-flipped top to bottom (i.e., in FIG. 2A, the VSS is on the bottom of the ECO cell 2020, whereas in FIG. 3A, the VSS is on the top of the ECO cell 2020). The ECO cell 2020 has a y-offset consistent with the cell height of the ECO cell 2010, thereby sharing the VDD track (i.e., M0 track 106). The M1 tracks in the ECO cells 2010 and 2020 are now vertically aligned with each other. Since the instantiations are now vertically stacked and mirror-flipped as stated earlier, additional M1 segments 302 and 304 are added to connect to the M1 tracks 271 and 275, and the M1 tracks 273 and 277, respectively. These added M1 segments 302 and 304 connect each of the respective inputs in the ECO cell 2010 and the ECO cell 2020. M2 shape 380 makes connections to the M1 tracks 271 and 272 through the V1 vias 281 and 282, respectively. M2 shape 379 makes connections within the ECO cell 2020 to the M1 tracks 276 and 277 through the V1 vias 285 and 286, respectively. Using the above-described modifications and placements, a multi-row realization of the DCAP circuit 300 may be realized. Approaches like those described above allow ECO realizations to be crafted using fewer lateral poly-pitches albeit with additional total height.

Against the backdrop of the ECO cell 100 of FIG. 1 and the DCAP circuit 200 of FIG. 2 and DCAP circuit 300 of FIG. 3, exemplary aspects of the present disclosure are presented. In particular, exemplary aspects of the present disclosure capitalize on the flexibility of the ECO cell 100 in providing fill cells to help pattern density and the like in manufacturing. While there are a variety of fill types available, including those that are purely for healing/filling an empty space, each in a finite number of poly-pitches (from one (1) to N, where N is dictated by the size of the IC), other fills may be specifically designed as a DCAP function, without regard for ECO considerations. The last general type of fill is one where the fills are designated for ECO considerations, but not specifically designed for DCAP functions.

The ECO cells 100 provide great flexibility in meeting multiple needs for the designers. Specifically, the ECO cells 100 may be inserted as DCAP functions, but may readily be repurposed for ECO functions. Ideally, as many empty locations in the design as possible would be filled with DCAP functions. This arrangement provides a wealth of decoupling capacitance to aid power distribution and reduce noise issues. If the ECO cell 100 is placed as an ECO cell (instead of as part of a DCAP), the ECO cell 100 may also be repurposed to create other logic functions or help repair a bug or address a timing issue. Note that ECO cells used as DCAPs may also be repurposed, albeit most likely losing DCAP functionality. However, such trade off may be appropriate to cure a logic fault or other issue during a subsequent design pass. However, to use the ECO cell 100 as a DCAP, the empty locations would have to be at least 4 PP wide and multi-row or at least 8 poly pitches (PP) wide and single-row. Further, the empty space must have free M1 and M2 tracks consistent with the DCAP circuit's requirements. Exemplary aspects of the present disclosure provide a process that automates the evaluation of empty space to see if it is suitable for use with a multi-purpose DCAP circuit (e.g., one made from the ECO cells 100). In the event that the space is not suitable for use as a multi-purpose DCAP, the space may be considered for a dedicated DCAP, a generic multi-purpose ECO cell, or even a generic fill cell depending on the constraints of the space.

Figure 14:
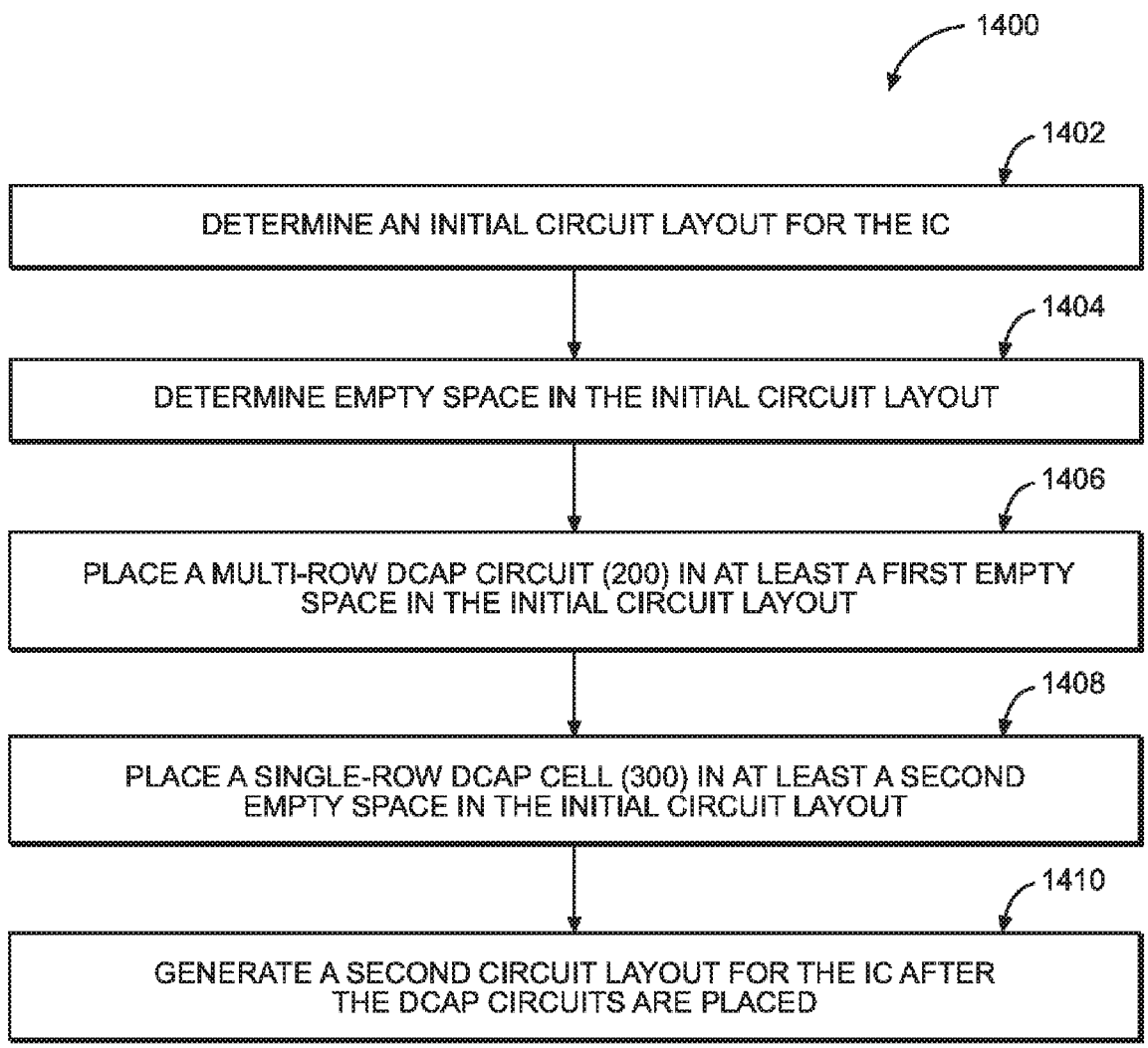
FIG. 14 provides a flowchart illustrating a high-level process of the present disclosure from which the processes of FIGS. 4A and 4B may be derived.

At its simplest, the process through which an IC may be designed may be summarized as set forth in FIG. 14. In particular, a process 1400 begins by determining an initial circuit layout for the IC (block 1402). This initial layout may be generated by place and route software based on an identification of circuit elements and needed interconnections. Based on this initial layout, empty space within the initial circuit layout is determined (block 1404). Software instantiating the process 1400 may then place a multi-row DCAP circuit 300 in at least a first empty space in the initial circuit layout (block 1406). The software may then place a single-row DCAP circuit 200 in at least a second empty space in the initial circuit layout (block 1408) and generate a second circuit layout for the IC after the DCAP cells are placed (block 1410).

Figure 4A:
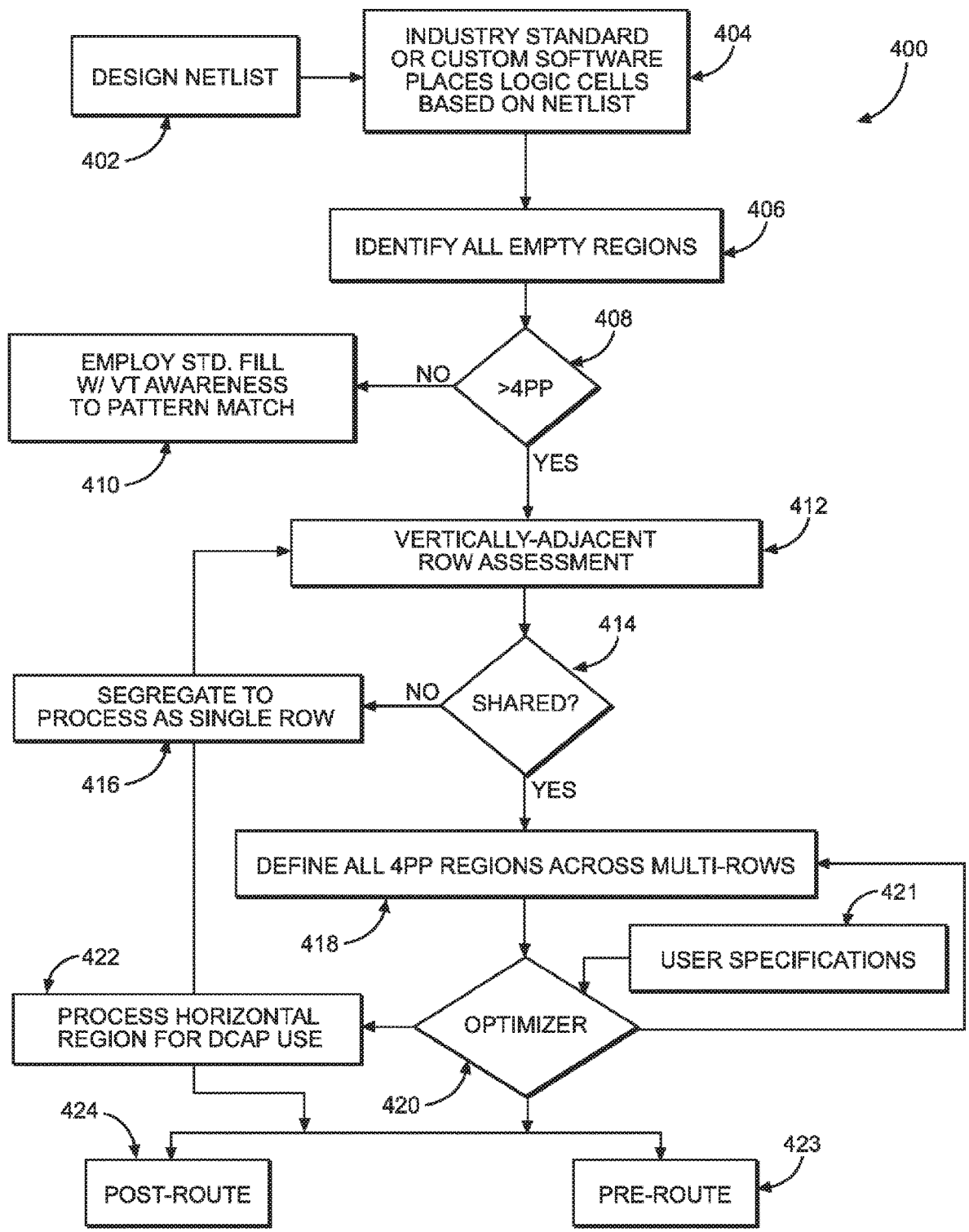
FIG. 4A is a flowchart illustrating an exemplary integrated circuit (IC) design method using ECO cell architectures.
Figure 4B:
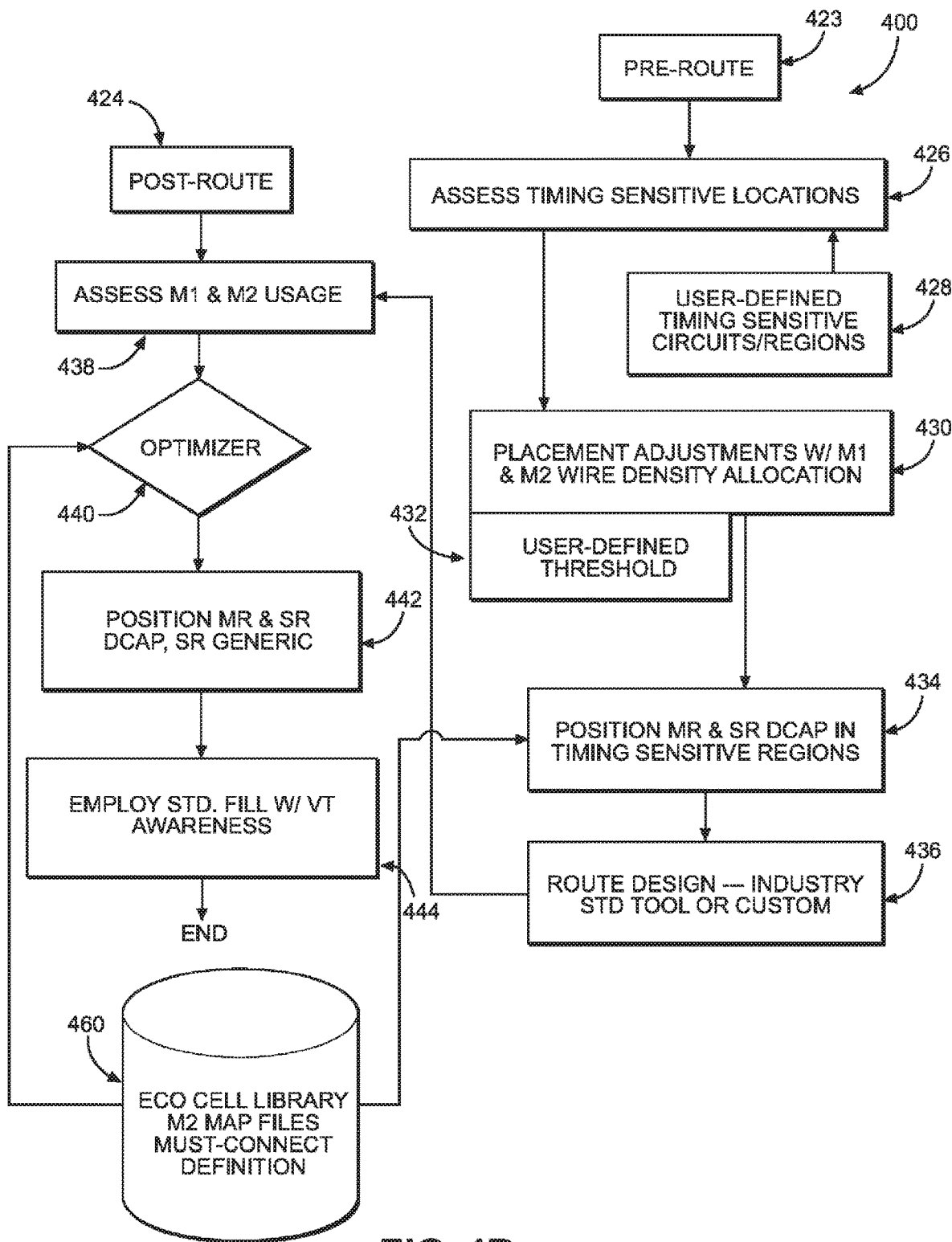
FIG. 4B is a flowchart illustrating pre- and post-route design methods.

FIGS. 4A and 4B provide flowcharts for a more detailed process 400 that fills in the details omitted from the high-level process 1400. Process 400 is a process that a designer may use when designing an IC that optimizes placement of ECO cells to serve as either fill cells or DCAP cells. In an exemplary aspect, the process 400 may be implemented in software that may be stored in a non-transitory computer-readable medium and loaded into memory of a computing device for execution. The process 400 set forth in FIGS. 4A and 4B is further illustrated by FIGS. 5-10, which illustrate simplified block diagrams of intermediate stages of IC design with logic cells filled in at each step. As illustrated, and for the purpose of useful example, in FIGS. 5-10, the IC for which the process 400 is performed has fourteen (14) placement rows, with row 1 at the bottom and row 14 at the top. This orientation is merely for convenience. The length of the IC is 152 poly pitches (PP).

Figure 5:
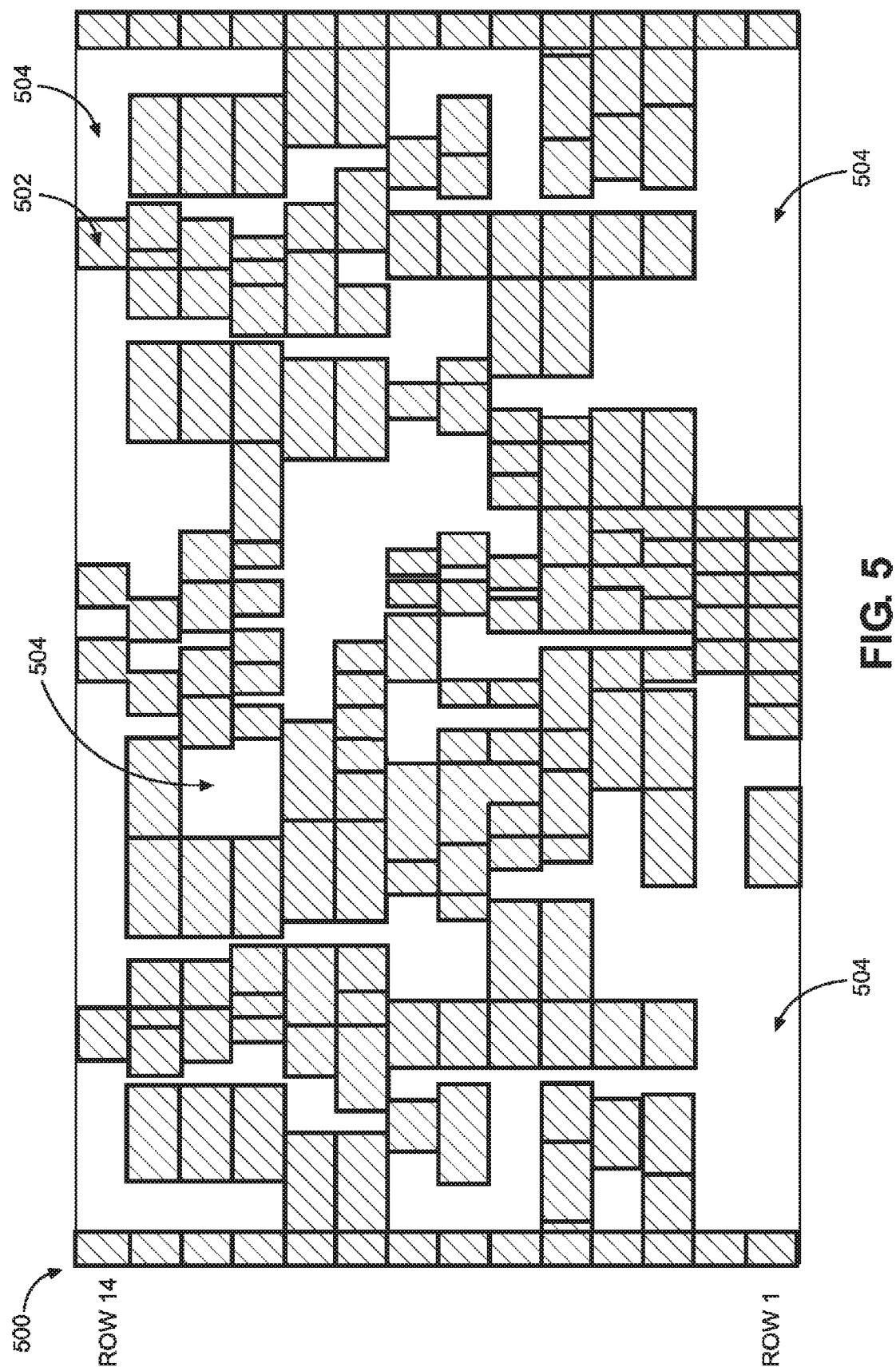
FIG. 5 is a top plan view of a simplified IC schematic in the midst of being designed after a macro pre-fill operation using standard cells.
Figure 6:
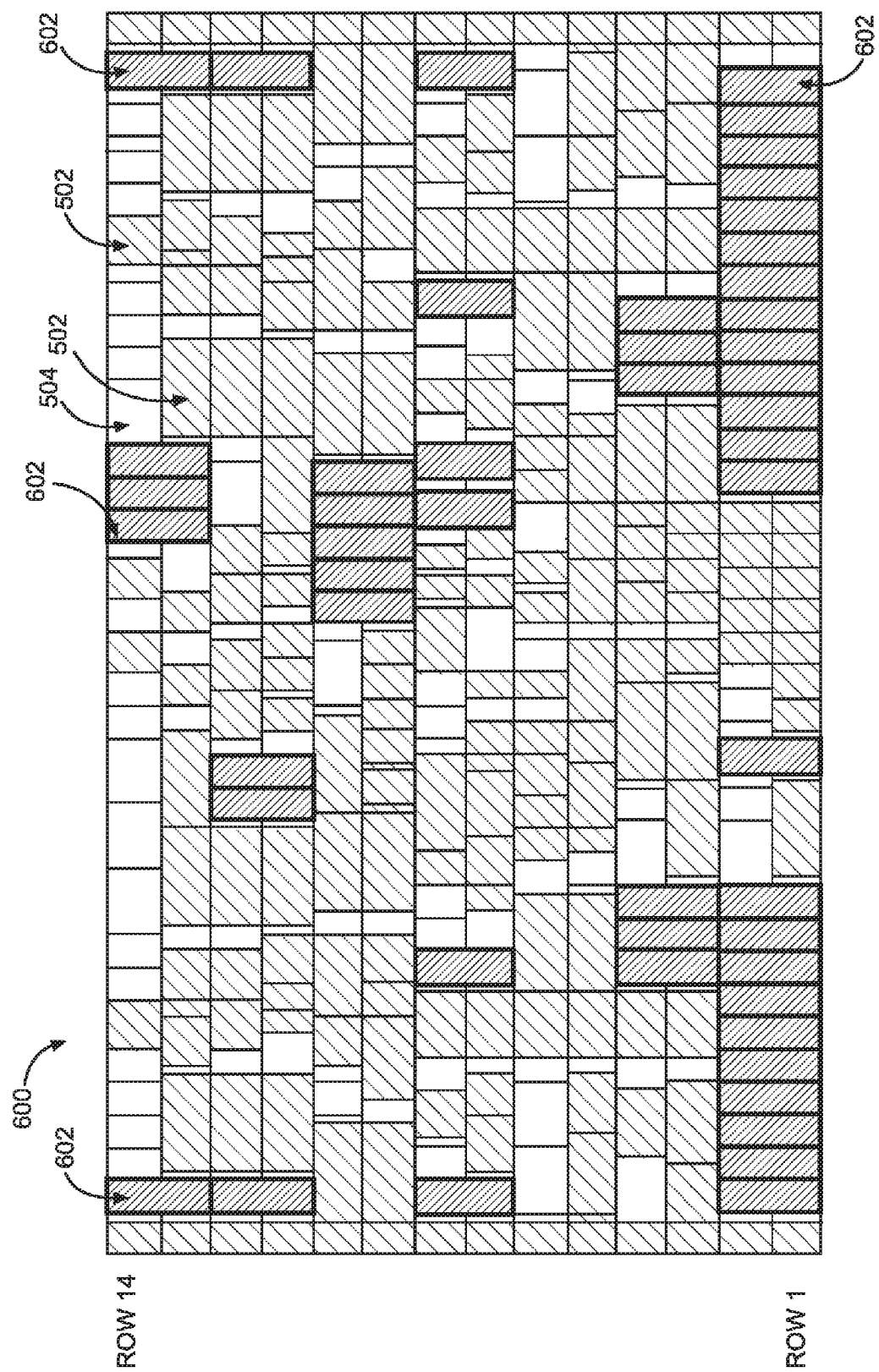
FIG. 6 is a top plan view of the simplified IC schematic of FIG. 5 after an ECO fill process is executed with multi-row ECO DCAP circuits highlighted after insertion.
Figure 7:
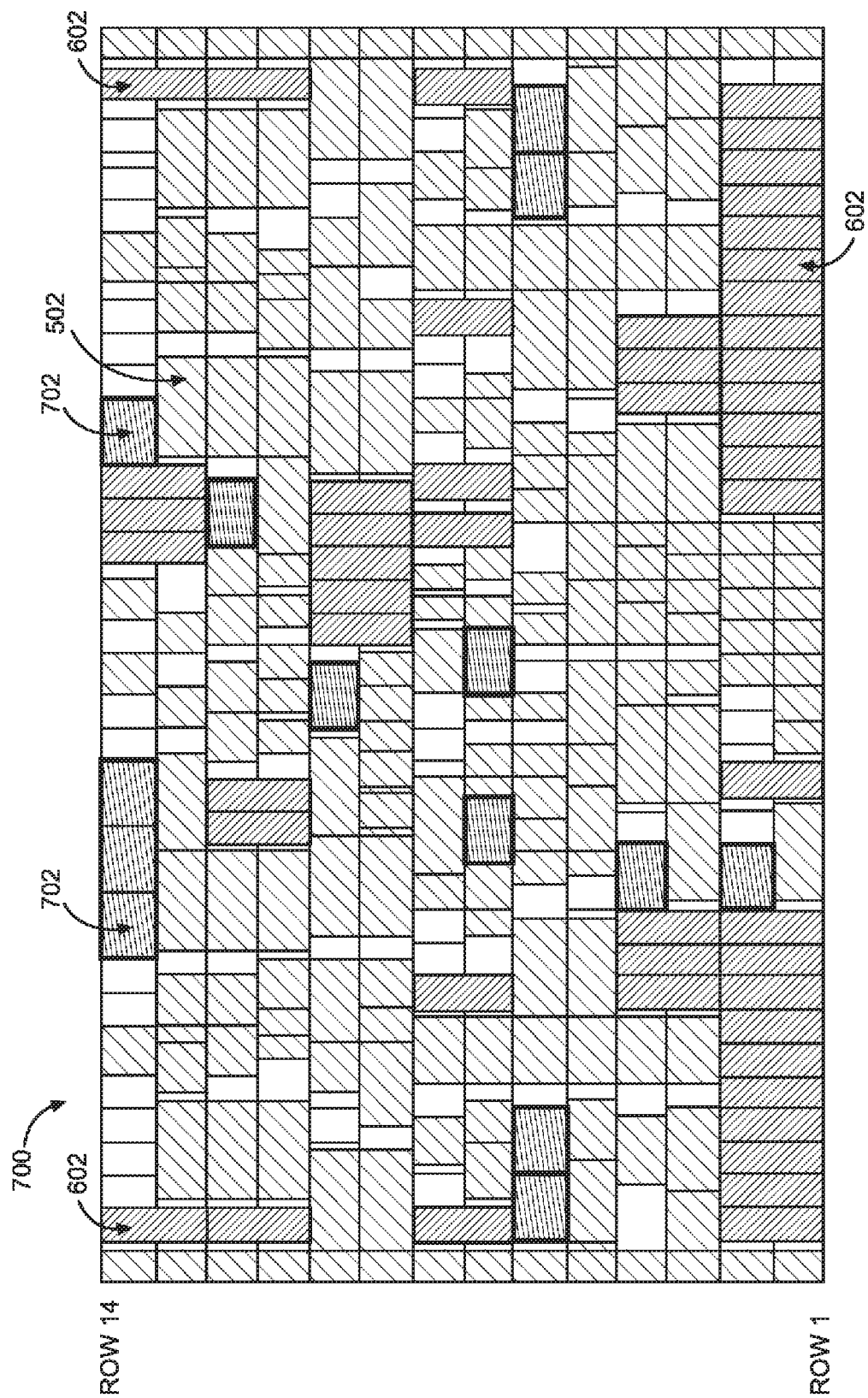
FIG. 7 is a cumulative top plan view of the simplified IC schematic of FIGS. 5 and 6 after an ECO fill process is executed with single-row ECO DCAP circuits highlighted after insertion.

Before the process 400 begins, a designer identifies the general needs for an IC as dictated by a purpose for the IC. From these general needs, the process 400, illustrated in FIG. 4A, begins by designing a netlist (block 402) that describes logic gates and cells and their associated connectivity that provide functions to satisfy the general needs. The logic cells of the netlist may be placed by any combination of industry standard placement and routing tools and/or a custom software package (block 404, also loosely 1402 of FIG. 14). These are the primary functional blocks of the IC being designed and may be placed to have access to pins on the IC as well as appropriate interconnections in the metal layers of the IC. This initial placement may contain regions where no logic functional gates or pre-reserved blockages exist and thus are considered "empty." FIG. 5 illustrates an exemplary intermediate design 500 that illustrates placement of these logic functional blocks 502. The process 400 thus continues by identifying all empty regions (block 406 and loosely 1404 of FIG. 14) of the intermediate design 500 (FIG. 5). This is shown conceptually in FIG. 5 where the cross-hatched sections illustrate logic functional blocks 502 and the open space illustrates "empty" space 504. The total number of placement sites in FIG. 5 is defined as a number of rows times the macro length, or as illustrated— 14*152=2128. For the purposes of this example, the netlist corresponds to a macro that has a placement density of approximately 55.6%, thereby having approximately 44.4% (944 sites) of the total available area available for some form of fill. These values are typical for circuit design using current technologies, although it should be appreciated that for some designs, these values may be higher or lower.

Returning to FIG. 4A, once the identification of the empty space 504 is done, the process 400 determines the size of a given portion of the empty space 504. Since the contemplated ECO cell 100 is 4 PP wide, the software seeks to segregate the linear regions by assessing whether there exists an empty region that is greater than or equal to 4 PP (block 408). Since other ECO cells could be used, more generally, this step may be thought of as determining whether a particular patch of the empty space 504 is "big enough" to accommodate the ECO cell 100. In this sense, big enough means having enough PP and cell height (i.e., the y-axis dimension) to have the ECO cell 100 fit therewithin. If the answer to block 408 is negative, that a particular empty space is not big enough, then the process 400 employs standard fill software for that space using any voltage threshold (VT) awareness to pattern match (block 410).

If, however, the space is big enough at block 408, the process 400 then assesses vertically-adjacent empty space (block 412) to see if a vertical DCAP circuit such as the DCAP circuit 300 can be inserted into the empty space being considered. That is, the process 400 checks to see if two vertically-adjacent rows have 4 unused PP that are vertically aligned to support potential multi-row ECO use. This process 400 may look at the multi-patterning used to see if the appropriate poly pitches align and step through the empty space 504 according to the nature of the multi-patterning. For example, in a dual-pattern M1 mask, every other poly pitch is made with the same mask. So, the assessment may be made making two (2) poly pitch steps. If a tri- or quad-pattern mask is used, a different step size may be used to assess the space for suitability.

Having identified potential spots, the process 400 performs a shared row determination (block 414), which actually evaluates whether the vertically-adjacent cells can be used as a DCAP circuit 300. This evaluation looks at the metal use in both cells to see if the M1 and M2 metal layers have any pre-existing conflicts (e.g., blockages, global wiring routing, or the like) from placement of the netlist, or if there is any other constraint which would preclude use as the vertical two-cell DCAP circuit 300. If the answer at block 414 is negative, the two vertically-adjacent cells cannot be shared as a DCAP, then those regions are segregated off to be processed as a single row (block 416). The process 400 continues considering the assessment of block 412.

If, however, the answer to block 414 is yes, the process 400 initially defines all suitable regions for use as the vertical DCAP circuit 300 (block 418). A row alignment optimizer may be invoked (block 420). This optimizer may align a maximum number or use some other user-defined specification to optimize placement of the vertical DCAP circuits 300 (block 421). The user-defined specifications may define a number of 4 PP regions across all row adjacencies. The adjacent row determination may also account for legal row adjacencies for multi-row placements. Some cell architectures have a cell height which may not be a full integer number of M2 tracks and might create row adjacencies which are not consistent with the multi-row placement. For example, assuming four rows labeled for the purpose of example 1-4, a multi-row cell may be placed in row 1 in a normal orientation, and in row 4 with a mirror about the x-axis placement. For the purpose of the example, rows 2 and 3 include M2 alignment and multi-patterning issues and thus do not support multi-row cell placement. Rows 2 and 3, in this example, would be disqualified for multi-row ECO cell placements but may still be eligible for single-row ECO cell placement. Once all the spaces are identified as being compatible (both for space and metal connections) with a vertical DCAP 300, these spaces are so designated (loosely 1406 of FIG. 14). These newly-placed regions are shown within an updated intermediate design 600 as DCAPs 602 in FIG. 6. While not specifically differentiated in FIG. 6, it is possible that various versions of the multi-row ECO DCAP are employed to satisfy any M2 blockages imposed by the existing wiring (also not shown for simplicity). The highlighted multi-row DCAP cells occupy 400 of the 944 empty sites, thereby representing approximately 42% of the empty area.

After optimizing the vertical DCAPs 300 in the intermediate design 600, the process 400 continues by processing the horizontal regions for DCAP use (block 422). That is, the process checks horizontally-adjacent cells to see if they can be used as a horizontal DCAP circuit such as the DCAP circuit 200. The process 400 checks to see if there are any issues with the M1 or M2 metal layers or other constraints which would preclude use as the DCAP circuit 200. The identified horizontal spaces suitable for the horizontal DCAP circuit 200 are set forth in intermediate design 700 as DCAPs 702 in FIG. 7 (loosely 1408 of FIG. 14). While not specifically differentiated in FIG. 7, it should be appreciated that various versions of the single-row ECO DCAP may be employed to satisfy any M2 blockages imposed by existing wiring (also not shown in FIG. 7 for simplicity). The highlighted DCAPs 702 occupy 112 of the 944 empty sites thereby representing about 12% of the empty area. Another optimizer (not shown) may be run on the horizontal spaces again taking into consideration any user specifications as described above. When considering the single-row and multi-row DCAPs, 512 of the 944 empty sites are now configured with various DCAP functions.

Note while the process 400 checks preferentially for vertical DCAP possibilities first, the present disclosure is not so limited. Rather, the process 400 could be modified to check for single-row DCAP possibilities first, then fill any remaining space with possible vertical DCAPs. Still further, the process 400 could be modified to see which preference maximizes the utilization of space as DCAPs. For example, if the process 400 is implemented as illustrated (i.e., vertical placement first, then horizontal) and yields a 45% (for example) utilization of empty space as DCAPs, but implementing a horizontal, then vertical check yields a 54% (or any number greater than 45%) utilization of empty space, the process may select the greater utilization.

Once the horizontal optimizer is complete, the output is then directed to pre-route processing (block 423) or post-route processing (block 424). Note that if the design has both pre-routed and post-routed sections concurrently, the process 400 addresses the pre-routed regions first. The pre-route processing (block 423) and the post-route processing (block 424) are better illustrated in FIG. 4B.

The process of block 423 highlights timing sensitive locations from attributes defined in the netlist (block 426) and/or any user-defined circuits or regions (block 428). Based on these inputs, placement adjustments may be made manually or using industry standard placement tools (block 430) that incorporate any user-defined thresholds regarding M1 and M2 wire density allocations (e.g., edge-to-edge tolerances or the like) (block 432) to define a preferred set of placement locations for ECO-based fill cells with a focus on ECO-based DCAPs.

Further, the user-defined thresholds (block 432) can also specify whether ECO-based DCAPs are to be pre-placed in regions that have M2 and M1 prewiring before a predefined threshold. This wiring density assessment can be associated with actual pre-routes and/or some wiring density estimator associated with a routing tool. By enabling this feature, it is possible to help ensure that specific ECO cells can be placed in low-route density regions with low probability of encountering wiring blockages caused by wiring that could otherwise be routed in other tracks by the routing tool.

Library 460 contains a cell library with cells having various functions, M2 map files, and must-connect definitions. The M2 map files are definitions of all various M2 customizations available for each ECO function. These definitions allow the use of a logical function ECO cell, like a multi-row DCAP and associated M2 track customizations to match placement needs. Similarly, the must-connect definitions allow a wiring tool to make the necessary inter-cell connections to support the logical function desired and the local wiring/blockage needs.

Using the library 460, the pre-route processing 423 positions the multi-row and single-row DCAP circuits 300 and 200 in timing sensitive regions (block 434). It should be appreciated that the preference here is to prioritize placement of the ECO DCAP circuits 300 and 200 as described earlier, but other choices can be set in the user-defined thresholds set in block 432 or other user-defined defaults.

Figure 8:
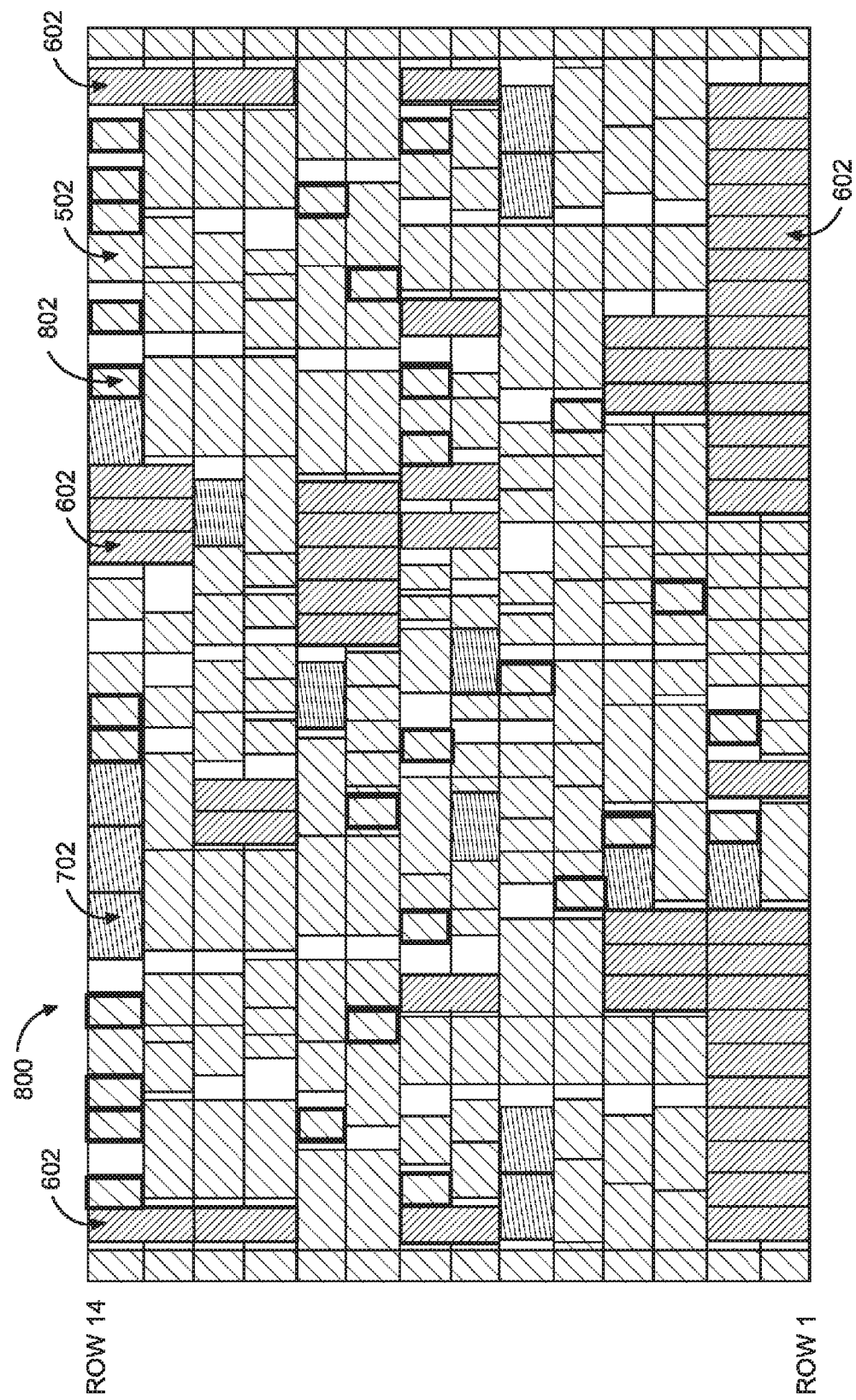
FIG. 8 is a cumulative top plan view of the simplified IC schematic of FIGS. 5-7 after an ECO fill process is executed with single-row ECO fill cells highlighted after insertion.

Once the DCAP positioning is complete, the design may now be sent to an industry standard or custom routing tool for completion of the pre-route processing 423 (block 436). The output of the pre-route processing 423 may be sent to the post-route processing 424 (block 424) and particularly to an assessment of existing M1 and M2 wiring usage (block 438). This assessment is passed to an optimizer (block 440) that seeks to re-map all possible multi-row and single-row 4 PP placement locations to support the widest usage of the default ECO cell 100 or the default DCAP circuits 200 and 300 while preserving all M1 and M2 blockages and restrictions associated with the placed and routed design along with the data from the library 460. Once the optimizer is complete, the definitions of what functions and what M2 customizations are to be used in that function are specified for each location and are used to perform the placements (block 442). Note that this step is where it is also possible to place the generic ECO cells. This step is illustrated in FIG. 8, where intermediate design 800 shows these single-row ECO cells 802. Note that the ECO cells 802 may be the basic ECO cell 100 or other generic ECO cell that fits in a space that is not suitable for a vertical or horizontal DCAP (e.g., too small or wiring conflicts). The use of the single-row ECO cell 100 in this fashion allows 116 of the 944 empty sites to be used, thereby representing about 12% of the empty area. Thus, when considering the single-row ECO cell 100 and the DCAP circuits 200 and 300, 628 of the 944 empty sites are configured to have various types of ECO cells.

Figure 9:
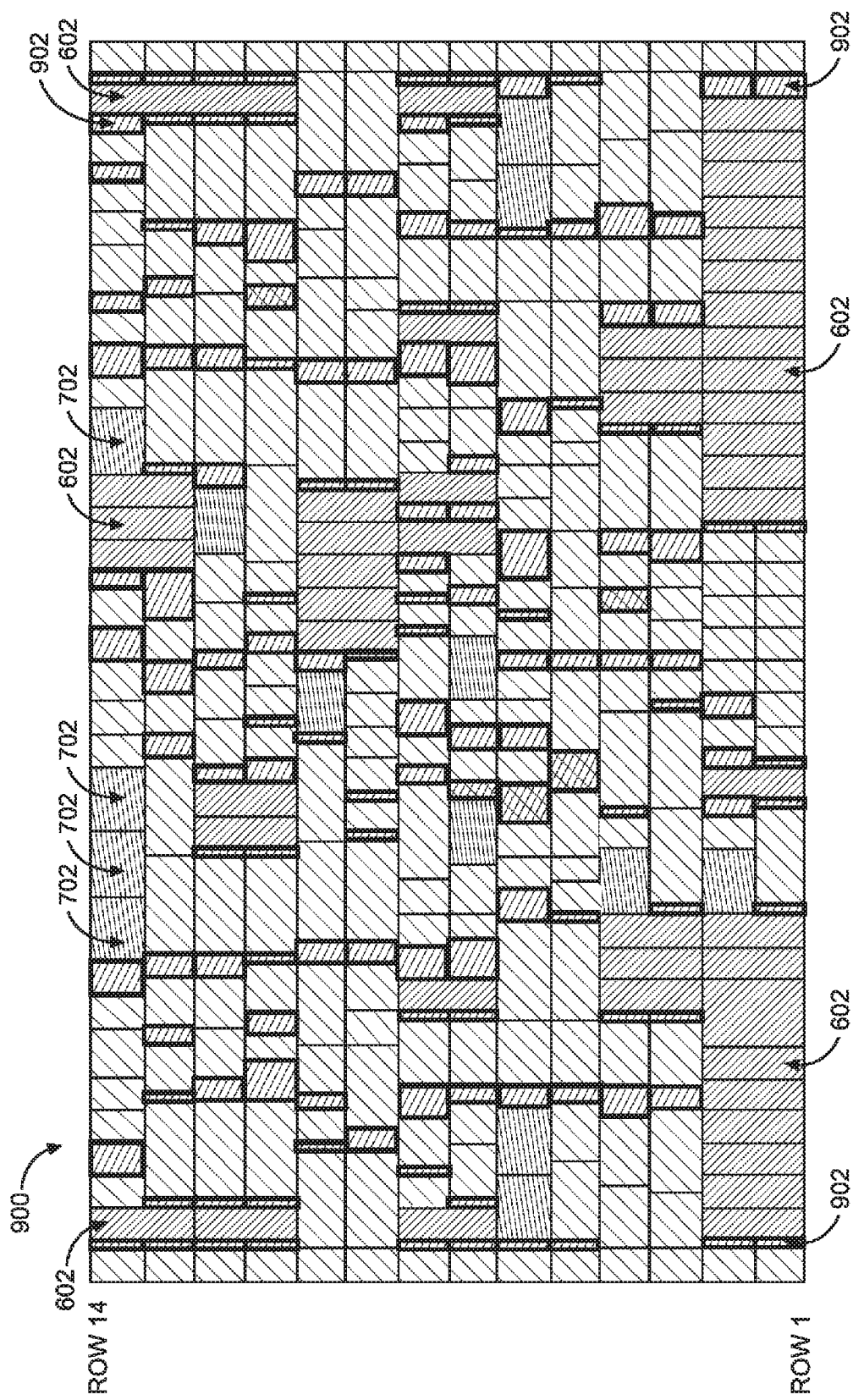
FIG. 9 is a cumulative top plan view of the simplified IC schematic of FIGS. 5-8 with single-row non-ECO fill cells inserted.

Once these cells are placed, the remaining locations that are unable to support DCAP or ECO cells may be filled using a voltage threshold (VT) aware standard fill software tool (block 444), which completes the design. This final fill step is illustrated in FIG. 9 where intermediate design 900 includes fill cells 902 in places where the ECO cells 100, DCAP circuits 200, 300, and original logic functions are not. The fill cells 902 fill any remaining empty regions that, due to their poly pitch being less than four or larger than four, but having other metal constraints cannot be filled with the ECO cell 100. In the example provided, these fill cells 902 occupy 316 of the 944 empty sites, thereby representing approximately 33% of the empty area.

Figure 10:
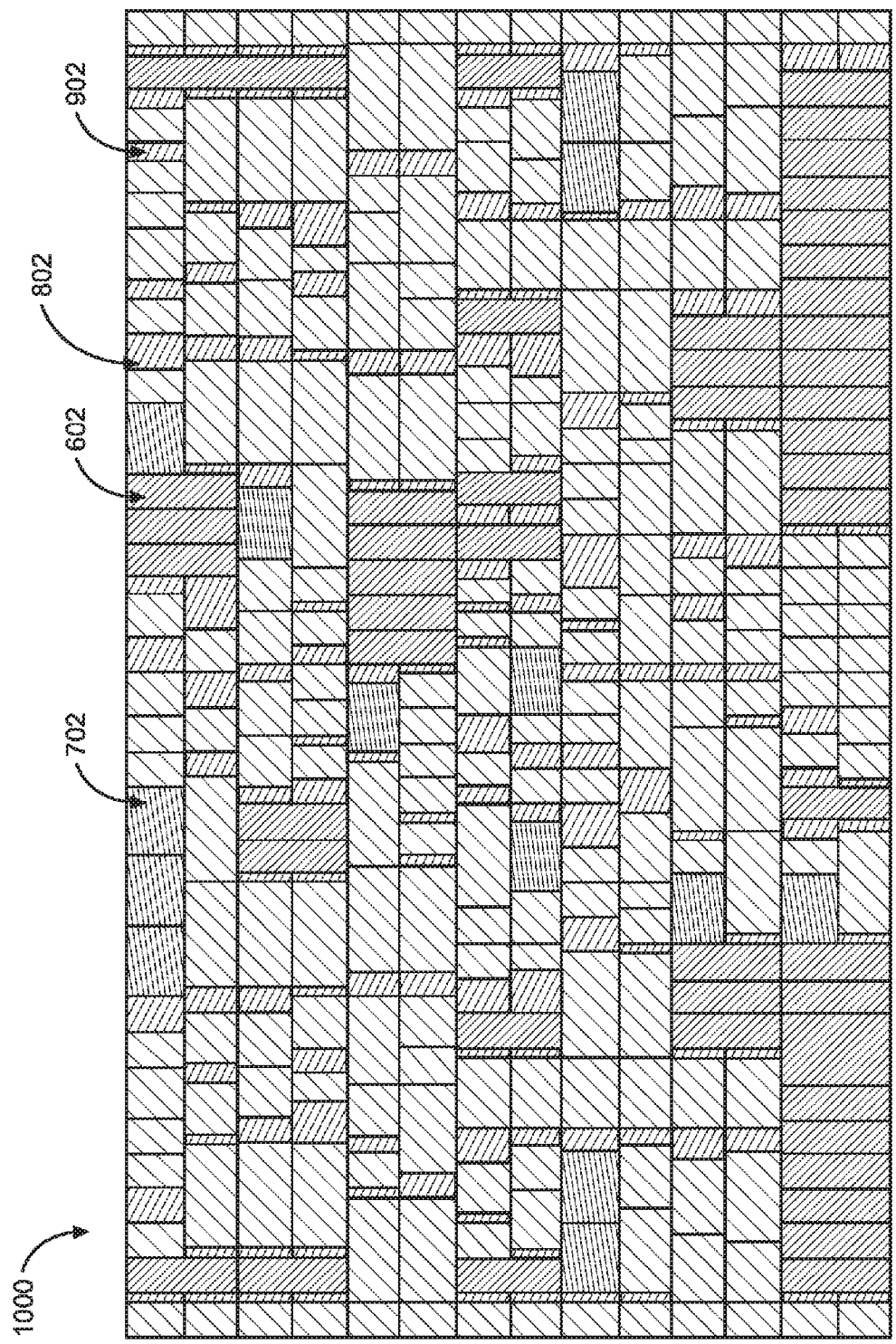
FIG. 10 is a cumulative top plan view of the simplified IC schematic of FIG. 5 combining the insertions of FIGS. 6-9.

The design, illustrated in FIG. 10 as final design 1000, may then be output in human-readable form (loosely 1410 of FIG. 14), machine- or computer-aided manufacture (CAM) format, or the like, and subsequently used to manufacture an IC. The final design 1000 illustrates the logic functional blocks 502, the vertical DCAPs 602, the horizontal DCAPs 702, the ECO cells 802, and the fill cells 902 filling the entirety of the final design 1000.

As part of the process associated with addressing M2 usage in regions where an ECO DCAP might be employed (i.e., blocks 414 and 416), there are several steps that may be taken. First, the position of any M2 tracks within the placement location that would prohibit any of the various single-row or multi-row ECO cells available from being employed is considered.

Once it is determined that a placement site can be potentially filled with the ECO DCAP circuit 200 or 300, the next step is to evaluate whether a horizontally-adjacent cell has any M2 in the same tracks as the available ECO DCAP circuit 200 or 300 under consideration. Thus, once a bounding box surrounding the M2 shapes in the common tracks of the ECO DCAP circuit 200 or 300 and the other adjacent cells is known, an assessment is performed to determine the next course of action. As used herein, a bounding box is a conceptual rectangle that covers the extent of the shape under consideration. That is, it bounds the area of the shape or shapes in question.

If the lateral distance (i.e., on the x-axis) between the M2 bounding boxes is greater than the layout ground rule (GR) minimum space, then no further action is needed (see FIG. 11A) and the ECO DCAP circuit 200 or 300 can be placed in the location without further evaluation.

If, however, the lateral separation is less than the required ground rule specification (FIG. 11B), then the process will determine if the M2 track can support a cut-M2 (CM2) shape that, when placed over a region between the two adjacent cells, will afford the proper ground rule relationship. The placement of the CM2 shape along with an added M2 shape 1101 connecting the ECO M2 and the adjacent cell's M2 will resolve the issue and allow an ECO DCAP circuit placement (FIG. 11C).

In addition to the lateral lookout being less than the required amount and initially being thought to be capable of supporting a CM2 shape, the process 400 also assesses the physical height (y-axis direction) of the adjacent cell's M2 shape bounding box ($Y_1$ and $Y_2$ in FIG. 11D). If the adjacent cell's M2 bounding box y-dimension is larger than the ECO cell's M2 bounding box ($Y_2 > Y_1$) and shares a common M2 track, then the process 400 determines that the CM2 approach cannot be employed and the ECO DCAP circuit placement is denied in that location (FIG. 11E).

Figure 12:
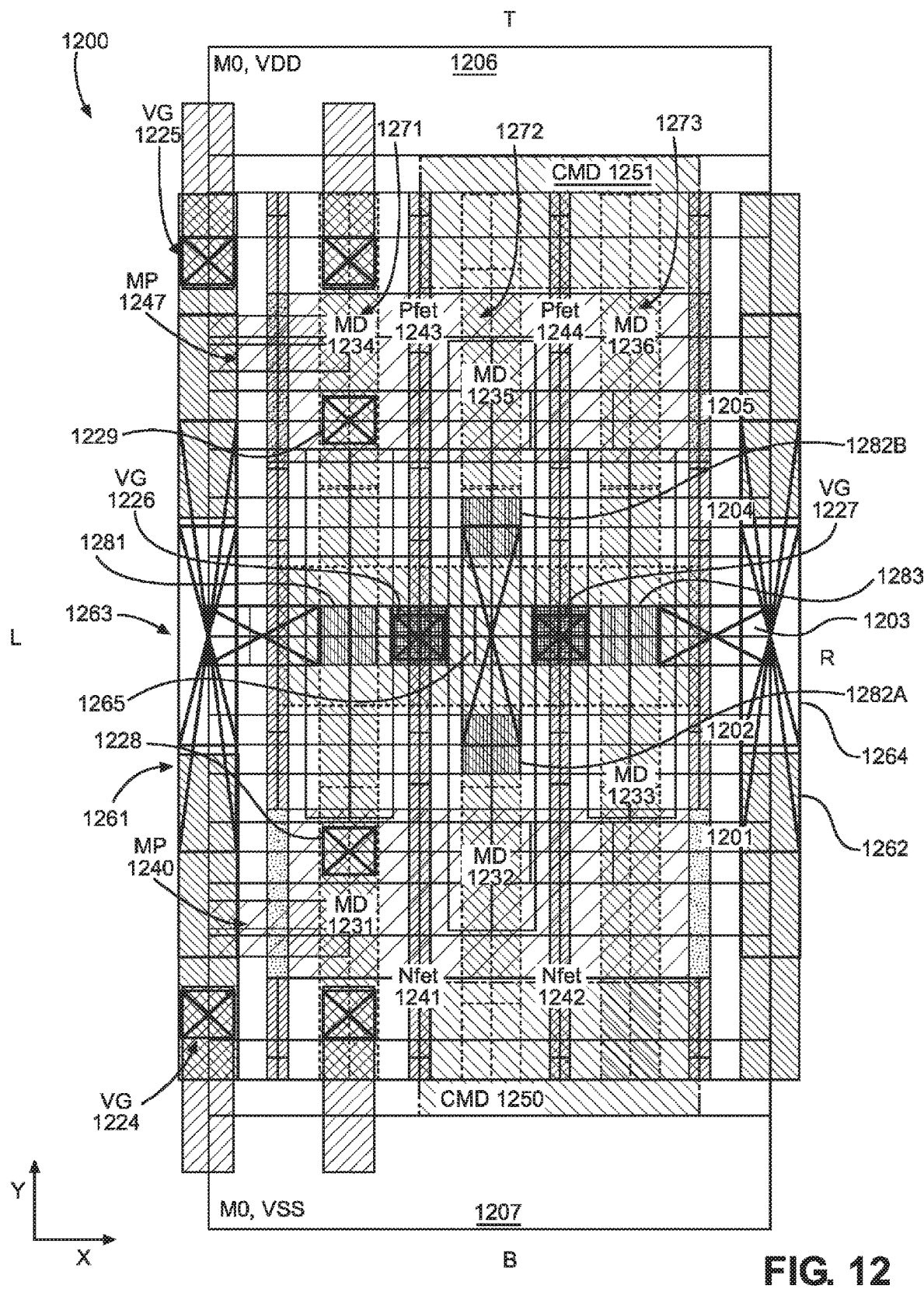
FIG. 12 is a top plan view of a second unconfigured ECO logic cell that may be used with the processes of the present disclosure.

The ECO cell 100 of FIG. 1 is adequate for many functions. However, other cells may also be used depending on node size, cell size, and the like. For example, FIG. 12 illustrates an ECO cell 1200 that may be characterized as an Ultra High Performance (UHP) cell. The ECO cell 1200 differs from the ECO cell 100 in that the ECO cell 1200 has a taller cell height (e.g., 360 nm) that supports larger fin count devices, but is otherwise organized substantially the same as the ECO cell 100. While the same number of M0 tracks are used, the spacing and width of the M0 tracks may be varied relative to the ECO cell 100 in view of the different height. The edge M0 VDD and VSS rails may also be larger to support increased current used to support higher device fin counts.

The ECO cell 1200 has M0 tracks 1201 and 1205, which are dedicated to VSS and VDD, respectively in addition to the M0 VSS rail 1207 proximate the bottom (B) of the ECO cell 1200 and the M0 VDD rail 1206 proximate the top (T) of the ECO cell 1200. Connections to the M0 tracks 1201 and 1205 are through fixed VD vias 1228 and 1229, respectively. Thus, the path formed from the VG contacts, the MP jumpers 1240 and 1247, and the vias 1228 and 1229 establish the M0 tracks 1201 and 1205 as the ECO cell 1200 VSS and VDD, respectively. When the ECO cell 1200 is customized, such customization may use these M0 tracks for VSS and VDD connections rather than coupling to the M0 tracks 1206 and 1207 on the top and bottom of the ECO cell 1200. The source of NFET 1241 and the drain of PFET 1243 are connected to VSS and VDD, respectively through the vias 1228 and 1229. The drain of the NFET 1241, the source of the NFET 1242, and the drain of the NFET 1242 remain unconnected in the ECO cell 1200 allowing customization as explained in greater detail below. Likewise, the source of the PFET 1243, the drain of the PFET 1244, and the source of the PFET 1244 remain unconnected in the ECO cell 1200, again allowing customization as explained in greater detail below.

With continued reference to FIG. 12, CMD shapes 1250 and 1251 are along the top and bottom edges of the cell. The CMD shapes cut all MD shapes 1231-1236. Thus, no CMD modifications will be needed during an ECO.

The left (L) and right (R) edge base CM0A shapes 1261 and 1262 are similar to CM0A shapes 161 and 162 of the logic cell 100. However, the ECO cell 1200 has modified CM0B shapes 1263 and 1264 only cutting the M0 track 1203. Thus, the ECO cell M0 VSS 1201 and M0 VDD 1205 will be shared across all adjacent ECO cells creating a parallel VSS/VDD path throughout all ECO cells. CM0B 1265 is introduced to cut the M0 track 1203 at mid-track. This cut breaks the continuity between the device set of NFET 1241 and PFET 1243 and the device set of NFET 1242 and PFET 1244 through the VG vias 1226 and 1227, respectively. This CM0B 1265 allows the gates of these respective device sets to be connected as needed through other higher sequence masking steps.

The ECO cell 1200 incorporates fixed location M1 and V0 via shapes. A first M1 track 1271 is located to the left of the VG via 1226 in a first M1 track location. A V0 via 1281 is located at the intersection of the first M1 track 1271 and the M0 track 1203. This arrangement forms an M0 to M1 to VG connection. The gates of the first device set of the NFET 1241 and the PFET 1243 are now connected to the first M1 track 1271. Likewise a third M1 track 1273 is located to the right of the VG via 1227 in a third M1 track location. A V0 via 1283 is located at the intersection of the third M1 track 1273 and the M0 track 1203. This arrangement forms an M0 to M1 to VG connection. Thus, the gates of the second device set of the NFET 1242 and the PFET 1244 are now connected to the third M1 track 1273. Finally, a second M1 track 1272 is located between the first and the third M1 tracks 1271 and 1273. The second M1 track 1272 has two V0 vias associated with it. One V0 via 1282A intersects M0 track 1202 and another V0 via 1282B intersects M0 track 1204. Thus, the second M1 track 1272 connects the M0 tracks 1202 and 1204.

The ECO cell 1200 is different from the ECO cell 100 of FIG. 1 in that the ECO cell 1200 includes the VG via 1225 on the M0 VDD rail and the VG via 1224 on the M0 VSS rail. Since the cell height is now taller, this architecture can support a direct connection of M0 track 1205 to VDD and M0 track 1201 to VSS. The MP jumpers 1240 and 1247 become redundant, but remain to provide a parallel path to the respective power supplies. Note further that while the use of the M0 and M1 layers in this fashion simplifies the design, other metal layers may be so used. As of this writing, the concepts of the present disclosure have been instantiated to a certain extent as software with an algorithmic process, which is included here for completeness. While exemplary aspects of the present disclosure are implemented by the process presented herein, the process is not intended to be limiting and is only provided to help the reader appreciate exemplary aspects of the present disclosure.

Before provision of the process, a few parameters are defined.

bBox is defined as a bounding box (lower left and upper right coordinates).

prBBox is defined as the pr boundary of the cell (lower left and upper right coordinates, and is present in each cell of the library 460.

instPrBoundaryBBox contains the prBboxes of all the instances in the design transformed to their appropriate x, y location in the top level macro.

placementBlockageBBoxes contains the bBoxes of all the blockage shapes in the design in the top level macro.

Gaps are defined as the empty space (i.e., the absence of a prBBox).

gapsNextRow is, as the name implies, the gaps in the row above the present row under evaluation.

Vddx, vdd_ar represent various labels for the power supply with vdd being a logic vdd and vdd_ar associated with an alternate supply, such as an array supply.

Vdd1, vdd2 represent the purposes of a layer-purpose pair for vddx and vdd_ar respectively.

Track colors red and green, as described below, represent two distinct mask patterns for dual-patterned metal masks. These are used to ensure no color or pattern type collisions occur on placement. In the event more than two patterns are used, additional colors may be used. Further, the specific colors are not central to the present disclosure, but merely used for convenience to help differentiate elements.

Initial data preparation is done
  a. Create lists of multi-row ECO cells, single-row ECO cells, and base ECO cells. Others may be created if desired.
  b. Go through each cell list, open each ECO cell and read the metallurgy information (M1 and M2)
    i. Store the bounding boxes (bBoxes) of the metal shapes in a lookup table (such as ECO library 460).
  c. Create a lookup table for the power mapping, store in ECO library 460
    i. Vddx gets mapped to purpose vdd1, vdd_ar gets mapped to purpose vdd2 and so on to support correct-by-construction schematic updating
  d. Create a table that will store the type of each of the subsequently placed ECO cells and the power domains Open a scratch cell view
  a. All the shape processing will be done here
For each cell instance in the design
  a. Find the prBBox
  b. Transform the prBBox to the top (transformed x, y local coordinates to macro top level coordinates) and use it create a rectangle in the scratch cell view
  c. Store the rectangle in the list instPrBoundaryBBoxes
    i. These rectangles will be used to find empty areas (gaps) in the design
For each blockage in the design:
  a. Find the prBBox
  b. Store the rectangles in the list placementBlockageBBoxes. These are the rectangles that will be used to find empty areas (gaps) in the design not covered by placement blockage. This allows regions within the PrBoundary shape to be defined as non-fillable.

Do Multi-Row ECO Cells First
For each row in the design:
  a. Find all empty placement sites (gaps) in the row using instPrBoundaryBBoxes and placementBlockagesBBoxes (blocks 408, 412, 414)
  b. For each gap:

--- i. If the gap is wide enough (e.g., 4 PP) to hold the multi-row ECO cell and it is an even row (site orientation R0):
      1. Transform the bBox of the current gap to move into the next row above the current row
      2. Find all gaps within the transformed BBox (gapsNextRow)
      3. For each gap in gapsNextRow:
        a. Set x to the left edge of the gap
        b. While (x+width of the multirow ECO cell) < right edge of the gap
          i. If the first M1 of the ECO cell falls on a green track:
            1. Check if there is an overlap between already existing M1 at the current x location and the M1 in the ECO cell (block 430)
            2. If there is no M1 overlap:
              a. For each cell in the list of multirow ECO cells:
                i. Check if there is an overlap between already existing M2 at the current x location and the M2 in the ECO cell
                ii. Check if there is any wide metal nearby that would cause a design rule check (DRC) violation if the cell was placed in the current location
                iii. If there are no conflicts with the user specifications (block 442):
                  Place the ECO cell at the current x location with orientation R0

-continued

Find the power domain of the current location and store it in the placed ECO cell table
                Set x to x+(width of the multirow ECO cell)
                Take the bBox of the prBoundary of the ECO cell just placed - using that bBox, create a rectangle in the scratch cell view and update instPrBoundarybBoxes
            iv. Else:
                Set x to x+2*(width of a placement site)
Note: the +2 offset is used to preserve the M1 color alignment for a dual patterned metallurgy
        3. Else:
             i. Set x to x+2*width of a placement site)
ii. else:
    set x to x+(width of placement site)

Place the Single-Row ECO Cells (Block 442)
For each row in the design:
a. Find all empty placement sites (gaps) in the row
b. For each gap:

i.  If the gap is wide enough for a single-row ECO:
    1.  Set x to left edge of the gap
    2.  While x+(width of the single-row ECO cell) < right edge of the gap:
        a. If the first M1 track is located at the left PrBoundary edge the ECO cell falls on a green track:
           i. Check if there is an overlap between already existing M1 at the current x location and the M1 in the ECO cell
           ii. If there is no M1 overlap:
               1. For each cell in the list of single-row ECO cells:
                   a. Check if there is an overlap between already existing M2 at the current x location and the M2 in the ECO cell
                   b. Check if there is any wide metal nearby that would cause a DRC violation if the cell was placed in the current x location
                   c. If there are no conflicts:
                      i. Place the ECO cell at the current x location with the orientation determined by the row
                      ii. Find the power domain of the current location and store it in the placed ECO cell table
                      iii. Set x to x+(width of the single-row ECO cell)
                      iv. Take the bBox of the prBoundary of the ECO cell that was just placed and using that bBox, create a rectangle in the scratch cell view and update the instPrBoundaryBboxes
              d. Else:
                i. set x to x+2*(width of a placement site)
        2. Else:
           Set x to x+2*(width of a placement site)
Else:
    Set x to x+(width of a placement site)

Place the Base ECO Cells (Block 442)
For each row in the design:
a. Find all empty placement sites (gaps) in the row
b. For each gap:

i. Set x to the left edge of the gap
ii. While x+(width of the single-row ECO cell) < right edge of the gap
    1. If the first M1 of the ECO cell falls on a green track:
        a. Check if there is an overlap between already existing M1 at the current x location and the M1 in the ECO cell
        b. If there is no M1 overlap:
           i. For each cell in the list of single-row ECO cells
                1. Check if there is an overlap between already existing M2 at the current x location and the M2 in the ECO cell

```
            2. Check if there is any wide metal nearby that would
               cause a DRC violation if the cell was placed in the
               current location
            3. If there are no conflicts:
                a. Place the ECO cell at the current x location
                   with the orientation determined by the row
                b. Find the power domain of the current location
                   and store it in the placed ECO table
                c. Set x to x+(width of the single-row ECO cell)
                d. Take the bBox of the prBoundary of the ECO
                   cell that was just placed and create a rectangle
                   in the scratch cell view and update
                   instPrBoundaryBBoxes
        Else:
            Set x to x+2*(width of a placement site)
                Else
                    Set x to x+2*(width of a placement
                        site)
        Else
            set x to x+(width of a placement site)
```

Create the Necessary M2 Cuts and Extension to Satisfy the DRC Rules
  a. For each placed single-row and multirow ECO cell:
     i. For each M2 in the cell that is on mask color 2 (green) that can support a Cut_M2 (CM2B):
        1. Look to the left and right of the M2 on the x-axis
        2. If there is another M2 and the distance is less than required DRC space:
           a. Add M2 extension and an M2 cut shape (CM2B)
Update the Schematic
  a. If any ECO cells have been added to the schematic previously, then delete them first
  b. For each ECO type:
     i. For each power domain
        1. Add the corresponding symbol with a connection to the power domain to the schematic
        2. Make a bussed instance where the number of bits is equal to the number of ECO cells placed in the power domain
  c. Fill all remaining gaps with regular fill cells (block 410 and 444)

Implementing exemplary aspects of the present disclosure allows for better use of "empty" space in circuit designs. By virtue of being M1 and M2 "aware," exemplary aspects of the present disclosure allow for pre- and post-routing opportunities for user-defined thresholds to be used to specify whether ECO DCAPs are to be pre-placed in regions where M1 and M2 wiring density is below some threshold. Exemplary aspects of the present disclosure are further aware of any critical timing constraints for the circuit and thus may pre-place ECO cells in such a manner as to allow for ready changes to accommodate bugs in the timing. Exemplary aspects of the present disclosure are capable of being change aware. In areas defined as being timing critical, or having negative timing slack, the tool is timing aware and as such, these are regions that may have a higher probability of needing change to fix timing related issues.

Further, exemplary aspects of the present disclosure are capable of exploiting single- and double-row placements. Because it is assumed that double-row placement is more challenging than single-row placement, exemplary aspects of the present disclosure may optimize the double-row placement first. However, as noted above, the present disclosure is not so limited and the process may be run single-row first and the results compared to see which placement provides better fill for the circuit.

Exemplary aspects of the present disclosure contemplate using both 300 nm and 360 nm domain cells (ECO cells 100 and 1200, respectively). Further, exemplary aspects of the present disclosure are aware that the ECO cell 100 has asymmetrical M2 assignments while the ECO cell 1200 of FIG. 12 has symmetrical M2 assignments. This difference results in different placement attributes, but such placement attributes are readily accommodated. While 300 nm and 360 nm are specifically contemplated, other cell sizes may also be used.

Exemplary aspects of the present disclosure use a DCAP that is readily changed to an ECO cell as a first choice to provide a wealth of decoupling capacitance to aid in power distribution and reduce noise issues while offering the ability to be repurposed to create other logic functions to fix logic or timing issues while at the same time preserving reductions in mask changes and keeping time to market windows small.

Exemplary aspects of the present disclosure are able to select from a set of DCAPs and other logic functions with various M2 needs to more readily integrate in a post-routed design. In regions where there is adequate area, but no M2 is free, placement of generic ECO cells or other user-defined cells is permitted to create optimal fill for the empty space. Where no generic ECO cell is suitable, other normal pattern fill options still remain.

Exemplary aspects of the present disclosure allow a variety of user-defined variables including, but not limited to: minimum DCAP usage over a moving region; maximum DCAP usage (where DCAPs may be depopulated uniformly to satisfy the maximum with the knowledge of a high drive strength circuit where no depopulation occurs); lookouts in two or four PP increments in the x-axis direction; and single- versus multi-power domain possibilities for ease of schematic updates.

The circuits designed according to processes disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
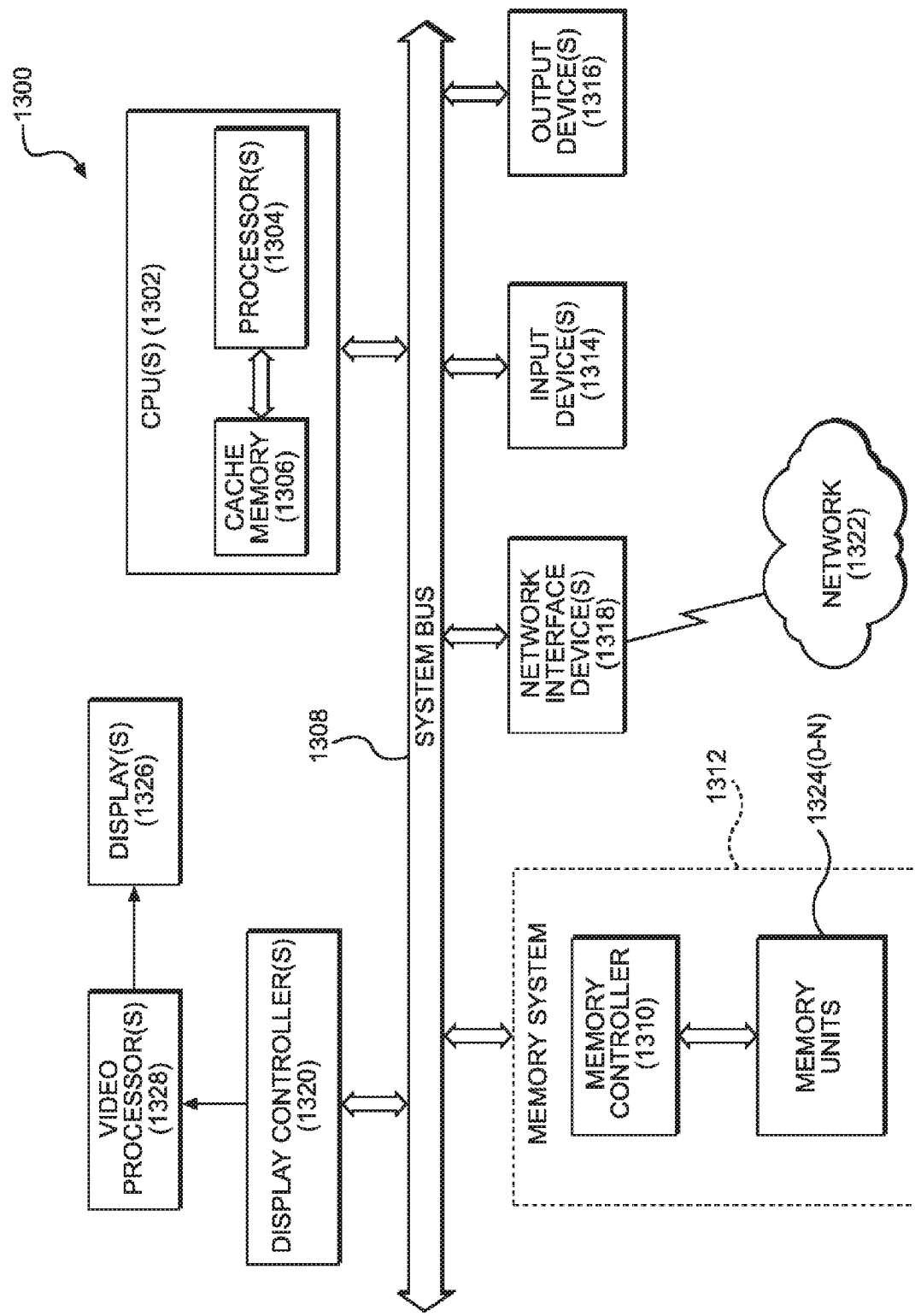
FIG. 13 is a block diagram of an exemplary processor-based system that can include ICs having the optimized ECO placement according to the processes of the present disclosure.

In this regard, FIG. 13 illustrates an example of a processor-based system 1300 that can employ ICs incorporating the ECO cell 100 or the ECO cell 1200 illustrated in FIGS. 1 and 12 as placed by the process 400 of FIGS. 4A and 4B. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320 as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any devices configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0-N).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A non-transitory computer-readable medium having stored thereon computer executable instructions which, when executed by a processor, cause the processor to perform a method, the method comprising:
   determining an initial circuit layout for an integrated circuit (IC);
   determining empty space in the initial circuit layout;
   placing a multi-row decoupling capacitor (DCAP) cell comprising a DCAP circuit in at least a first empty space in the initial circuit layout;
   placing a single-row DCAP cell in at least a second empty space in the initial circuit layout;
   generating a second circuit layout for the IC after the DCAP cells are placed; and
   forming the multi-row DCAP cell from two vertically-stacked single-row engineering change order (ECO) logic cells.

2. The non-transitory computer-readable medium of claim 1, wherein the method further comprises placing single-row engineering change order (ECO) logic cells in at least a third empty space in the initial circuit layout.

3. The non-transitory computer-readable medium of claim 1, wherein the method further comprises placing fill pattern cells in at least a fourth empty space in the initial circuit layout.

4. The non-transitory computer-readable medium of claim 1, wherein the method further comprises forming the single-row DCAP cell from an ECO logic cell.

5. The non-transitory computer-readable medium of claim 1, wherein the method further comprises prioritizing placement of either DCAP cell based on a timing constraint.

6. The non-transitory computer-readable medium of claim 1, wherein the method further comprises evaluating at least one metal layer of cells adjacent to a potential DCAP cell site in the IC before placing either DCAP cell.

7. The non-transitory computer-readable medium of claim 6, wherein evaluating the at least one metal layer comprises evaluating an M1 or an M2 metal layer.

8. The non-transitory computer-readable medium of claim 6, wherein evaluating the at least one metal layer comprises checking for blockages.

9. The non-transitory computer-readable medium of claim 1, wherein the method further comprises checking the first empty space to see that the multi-row DCAP cell fits within the first empty space.

10. The non-transitory computer-readable medium of claim 9, wherein checking the first empty space comprises checking to see if the first empty space is at least four (4) poly pitches wide along an x-axis direction.

11. The non-transitory computer-readable medium of claim 9, wherein checking the first empty space comprises checking to see if the first empty space is at least as tall as an ECO cell height along a y-axis direction.

12. The non-transitory computer-readable medium of claim 9, wherein the method further comprises placing a non-ECO single-row DCAP cell in the first empty space when an ECO cell does not fit within the first empty space.

13. The non-transitory computer-readable medium of claim 9, wherein an ECO cell does not fit because of an adjacent metal layer.

14. The non-transitory computer-readable medium of claim 1, wherein the method further comprises placing sufficient DCAP cells in the second circuit layout to allow a minimum DCAP usage.

15. The non-transitory computer-readable medium of claim 1, wherein the method further comprises limiting placement of additional DCAP cells in the second circuit layout based on a maximum DCAP usage threshold.

16. The non-transitory computer-readable medium of claim 1, wherein the method further comprises placing at least a third DCAP cell in a third empty space having a wiring density below a predefined threshold.

17. The non-transitory computer-readable medium of claim 1, wherein the method further comprises evaluating regions of low wiring density at an M2 metal layer and placing ECO-based DCAPs in the regions of low wiring density.

18. The non-transitory computer-readable medium of claim 1, wherein the method further comprises using a cell library that defines the multi-row DCAP cell and the single row DCAP cell.

19. The non-transitory computer-readable medium of claim 1, wherein the method further comprises forming the single-row DCAP cell from two horizontally-adjacent ECO logic cells.

* * * * *